(12) United States Patent
Peng et al.

(10) Patent No.: US 12,237,334 B2
(45) Date of Patent: Feb. 25, 2025

(54) SEMICONDUCTOR STRUCTURE

(71) Applicant: TAIWAN SEMICONDUCTOR MANUFACTURING COMPANY LTD., Hsinchu (TW)

(72) Inventors: Shih-Wei Peng, Hsinchu (TW); Wei-Cheng Lin, Taichung (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 573 days.

(21) Appl. No.: 17/378,493

(22) Filed: Jul. 16, 2021

(65) Prior Publication Data
US 2023/0020464 A1    Jan. 19, 2023

(51) Int. Cl.
*H01L 27/118* (2006.01)
*H01L 27/02* (2006.01)

(52) U.S. Cl.
CPC .... *H01L 27/11807* (2013.01); *H01L 27/0207* (2013.01); *H01L 2027/11875* (2013.01); *H01L 2027/11881* (2013.01)

(58) Field of Classification Search
CPC .......... H01L 27/11807; H01L 27/0207; H01L 2027/11881; H01L 23/5286
See application file for complete search history.

(56) References Cited

U.S. PATENT DOCUMENTS

| | | | | |
|---|---|---|---|---|
| 11,158,580 | B2 * | 10/2021 | Sio | H01L 23/5384 |
| 11,444,068 | B2 * | 9/2022 | Song | H01L 24/80 |
| 2014/0110771 | A1 * | 4/2014 | Yoda | H01L 27/14605 |
| | | | | 257/290 |
| 2020/0373242 | A1 * | 11/2020 | Hiblot | H01L 23/5384 |
| 2021/0118805 | A1 * | 4/2021 | Sio | H01L 21/4853 |
| 2022/0020735 | A1 * | 1/2022 | Song | H01L 24/80 |
| 2022/0028758 | A1 * | 1/2022 | Song | H01L 23/535 |
| 2022/0230947 | A1 * | 7/2022 | Park | H01L 23/49838 |
| 2022/0301878 | A1 * | 9/2022 | Xie | H01L 21/30625 |
| 2022/0399224 | A1 * | 12/2022 | Xie | H01L 21/76805 |

* cited by examiner

*Primary Examiner* — Mounir S Amer
*Assistant Examiner* — Alexander Belouso
(74) *Attorney, Agent, or Firm* — WPAT LAW; Anthony King

(57) ABSTRACT

A semiconductor structure includes a plurality of cells. Each cell has a plurality of transistors, a plurality of inner metal lines, two first backside power lines and one second backside power line. The inner metal lines, the first backside power lines and the second backside power line are disposed on a back side of the transistors. The inner metal lines, the first backside power lines and the second backside power line extend along a first axis. The second backside power line is disposed between the two first backside power lines. The inner metal lines are electrically connected to the first backside power lines and the transistors, and electrically connected to the second backside power line and the transistors. The cells are arranged along a second axis, the second axis being vertical to the first axis.

20 Claims, 24 Drawing Sheets

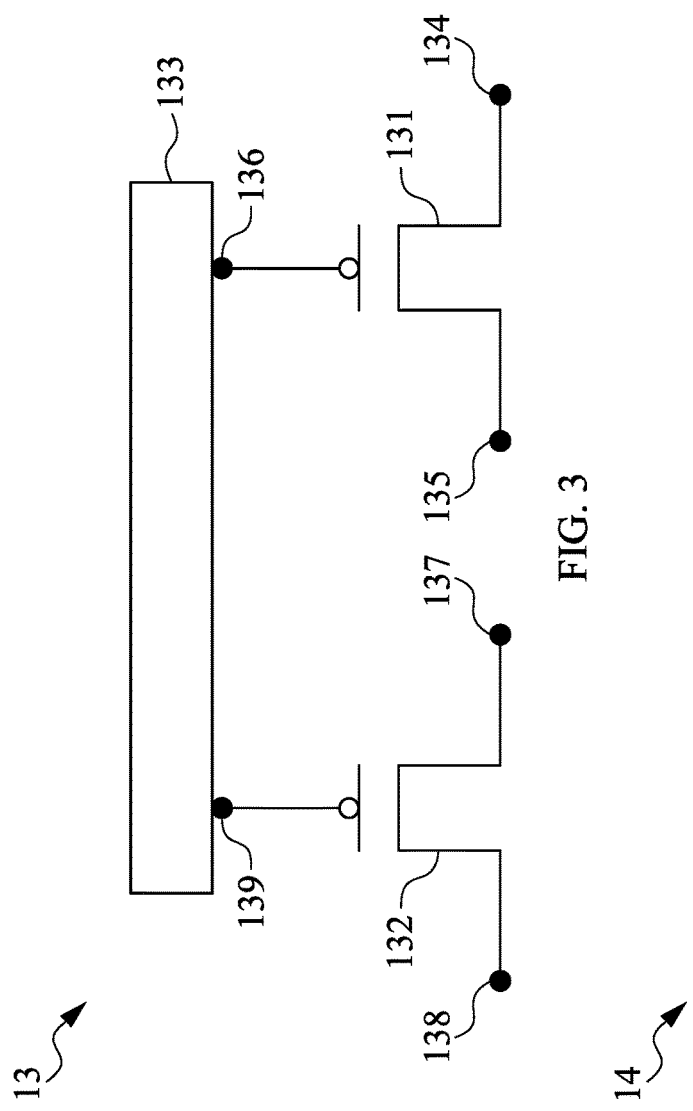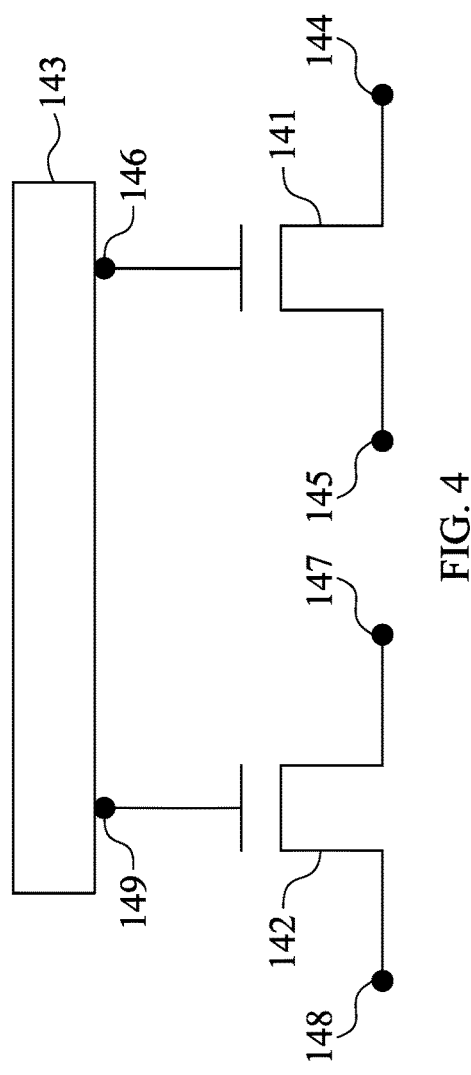

SEMICONDUCTOR STRUCTURE

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. However, reducing chip scale becomes more difficult due to the critical dimension of the line, and is slowing down due to the limitation of process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a mother and daughter type header circuit in accordance with some embodiments of the present disclosure.

FIG. 4 illustrates a mother and daughter type footer circuit in accordance with some embodiments of the present disclosure.

DETAILED DESCRIPTION

Figure 2:
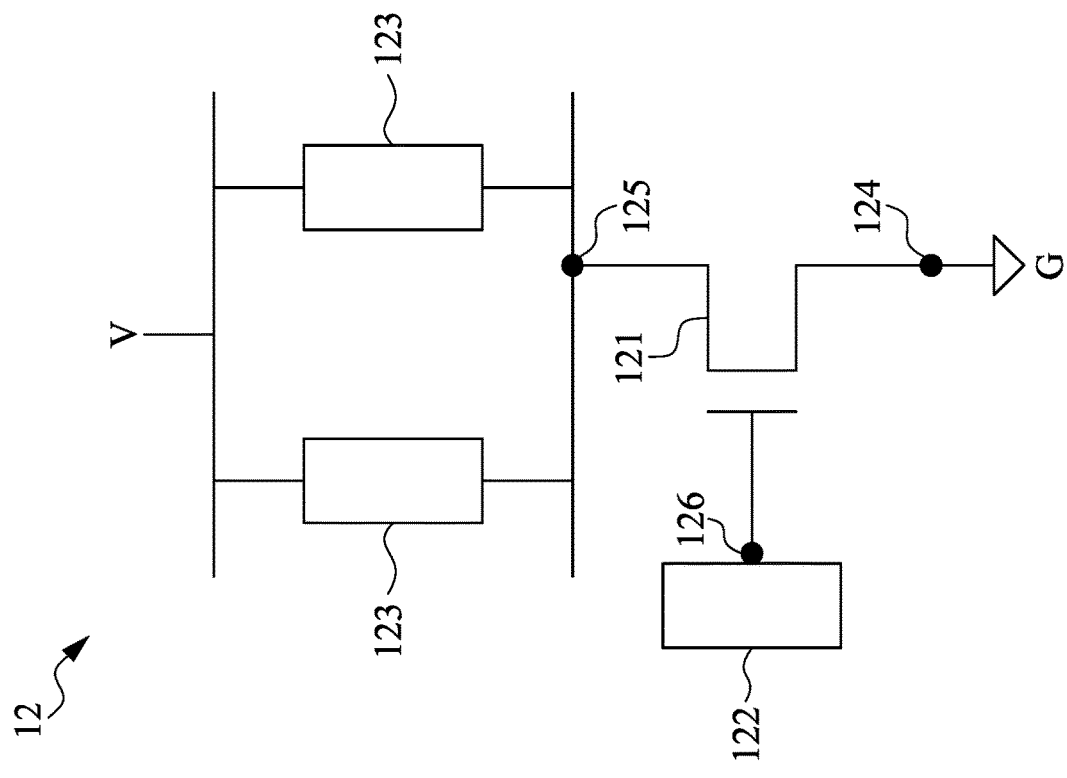
FIG. 2 illustrates a footer circuit in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
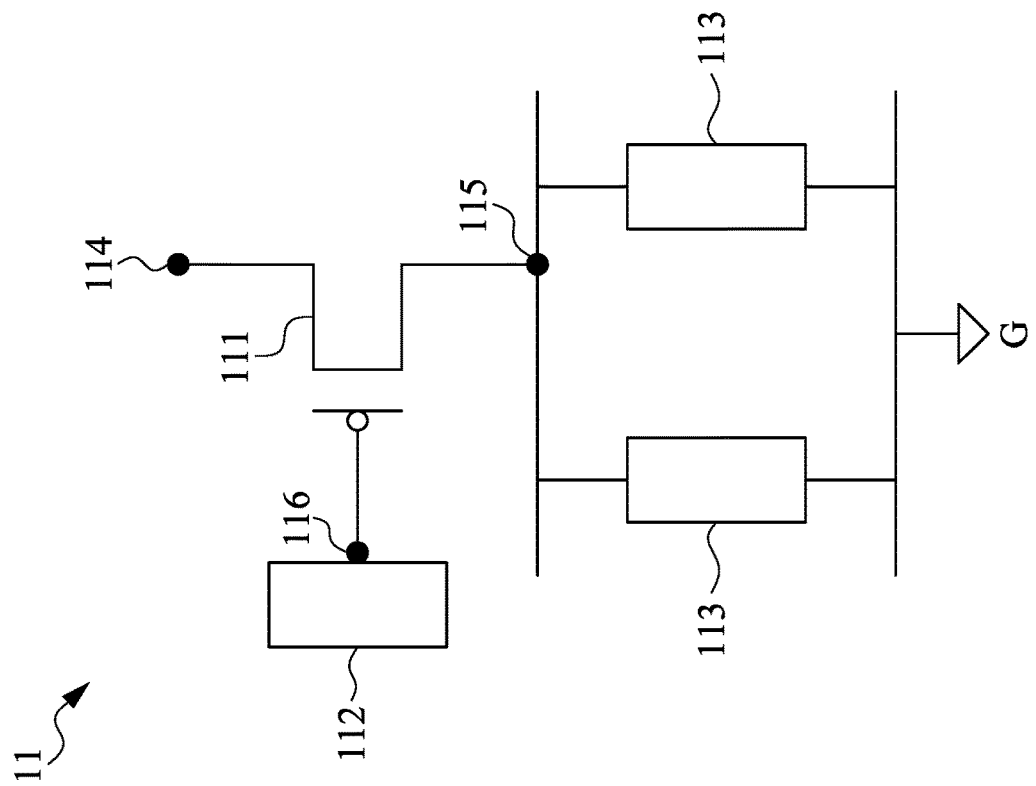
FIG. 1 illustrates a header circuit in accordance with some embodiments of the present disclosure.

Referring to the figures, wherein like numerals indicate like parts throughout the several views. FIG. 1 illustrates a header circuit in accordance with some embodiments of the present disclosure. Referring to FIG. 1, a header circuit 11 includes a PMOS transistor 111 and a control portion 112. The header circuit 11 is configured to control a plurality of logic blocks 113. The PMOS transistor 111 has a first power terminal 114, a second power terminal 115 and a control terminal 116. The first power terminal 114 is connected to a power source. The second power terminal 115 is connected to the logic blocks 113. The control terminal 116 is connected to the control portion 112. The control portion 112 is used to control the conduction between the first power terminal 114 and the second power terminal 115, and to control the power source to the logic blocks 113.

FIG. 2 illustrates a footer circuit in accordance with some embodiments of the present disclosure. Referring to FIG. 2, a footer circuit 12 includes a NMOS transistor 121 and a control portion 122. The footer circuit 12 is configured to control a plurality of logic blocks 123. The NMOS transistor 121 has a first power terminal 124, a second power terminal 125 and a control terminal 126. The first power terminal 124 is connected to a ground. The second power terminal 125 is connected to the logic blocks 123. The control terminal 126 is connected to the control portion 122. The control portion 122 is used to control the conduction between the first power terminal 124 and the second power terminal 125, and to control the logic blocks 123 to the ground.

FIG. 3 illustrates a mother and daughter type header circuit in accordance with some embodiments of the present disclosure. Referring to FIG. 3, a mother and daughter type header circuit 13 includes a mother PMOS transistor 131, a daughter PMOS transistor 132 and a control portion 133. The mother and daughter type header circuit 13 is configured to control a plurality of integrated circuitries. The mother PMOS transistor 131 has a first power terminal 134, a second power terminal 135 and a mother control terminal 136. The first power terminal 134 is connected to a power source. The second power terminal 135 is connected to the integrated circuitries. The mother control terminal 136 is connected to the control portion 133. The daughter PMOS transistor 132 has a first power terminal 137, a second power terminal 138 and a daughter control terminal 139. The first power terminal 137 is connected to the power source. The second power terminal 138 is connected to the integrated circuitries. The daughter control terminal 139 is connected to the control portion 133. The mother and daughter type header circuit 13 can provide power to integrated circuitries with good power-on responsive time and reduced power-on transient glitches. The daughter PMOS transistor 132 switch is turned on by the control portion 133, the mother PMOS transistor 131 is not turned on until the daughter PMOS transistor 132 has charged the voltage potential across power rails of the mother PMOS transistor 131 to a point where glitches are minimized.

FIG. 4 illustrates a mother and daughter type footer circuit in accordance with some embodiments of the present disclosure. Referring to FIG. 4, a mother and daughter type footer circuit 14 includes a mother NMOS transistor 141, a daughter NMOS transistor 142 and a control portion 143. The mother and daughter type footer circuit 14 is configured to control a plurality of integrated circuitries. The mother NMOS transistor 141 has a first power terminal 144, a second power terminal 145 and a mother control terminal 146. The first power terminal 144 is connected to a ground source. The second power terminal 145 is connected to the integrated circuitries. The mother control terminal 146 is connected to the control portion 143. The daughter NMOS transistor 142 has a first power terminal 147, a second power terminal 148 and a daughter control terminal 149. The first power terminal 147 is connected to the ground. The second power terminal 148 is connected to the integrated circuitries. The daughter control terminal 149 is connected to the control portion 143. The mother and daughter type footer circuit 14 can provide power to integrated circuitries with good power-on responsive time and reduced power-on transient glitches.

Figure 5:
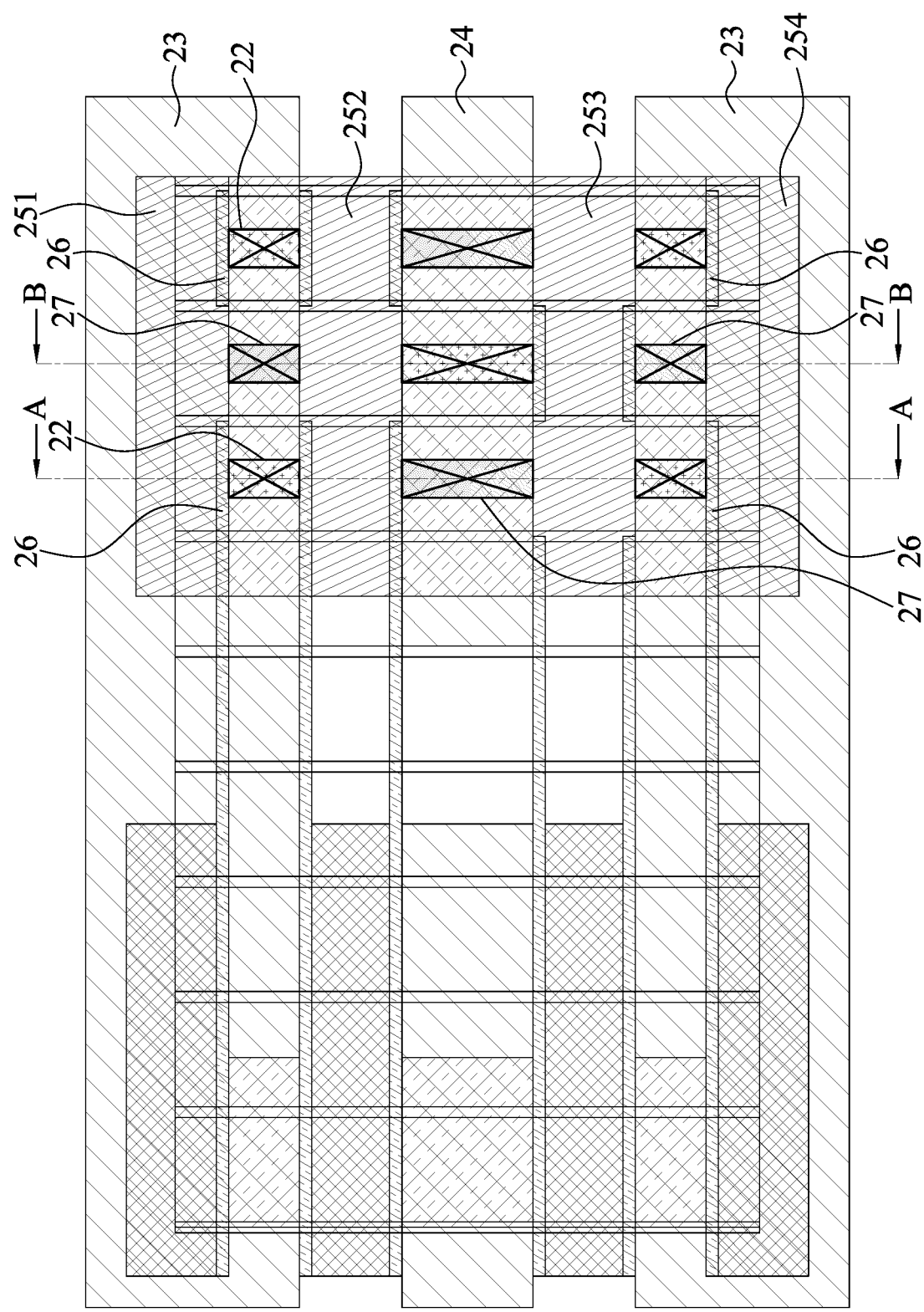
FIG. 5 illustrates a top view of a semiconductor structure in accordance with some embodiments of the present disclosure.
Figure 6:
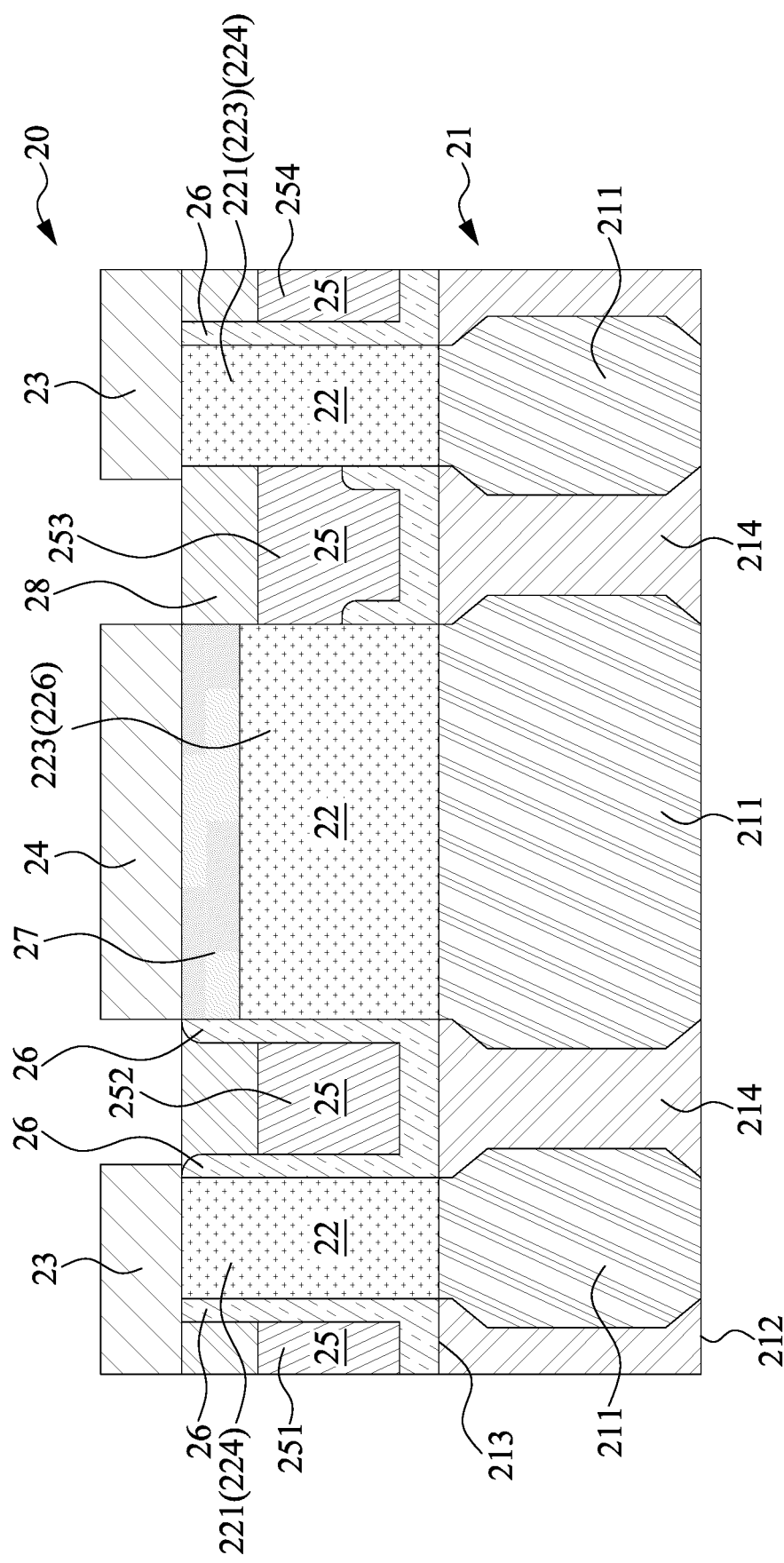
FIG. 6 illustrates a cross sectional view of a semiconductor structure along a cross section line A-A in FIG. 5 in accordance with some embodiments of the present disclosure.
Figure 7:
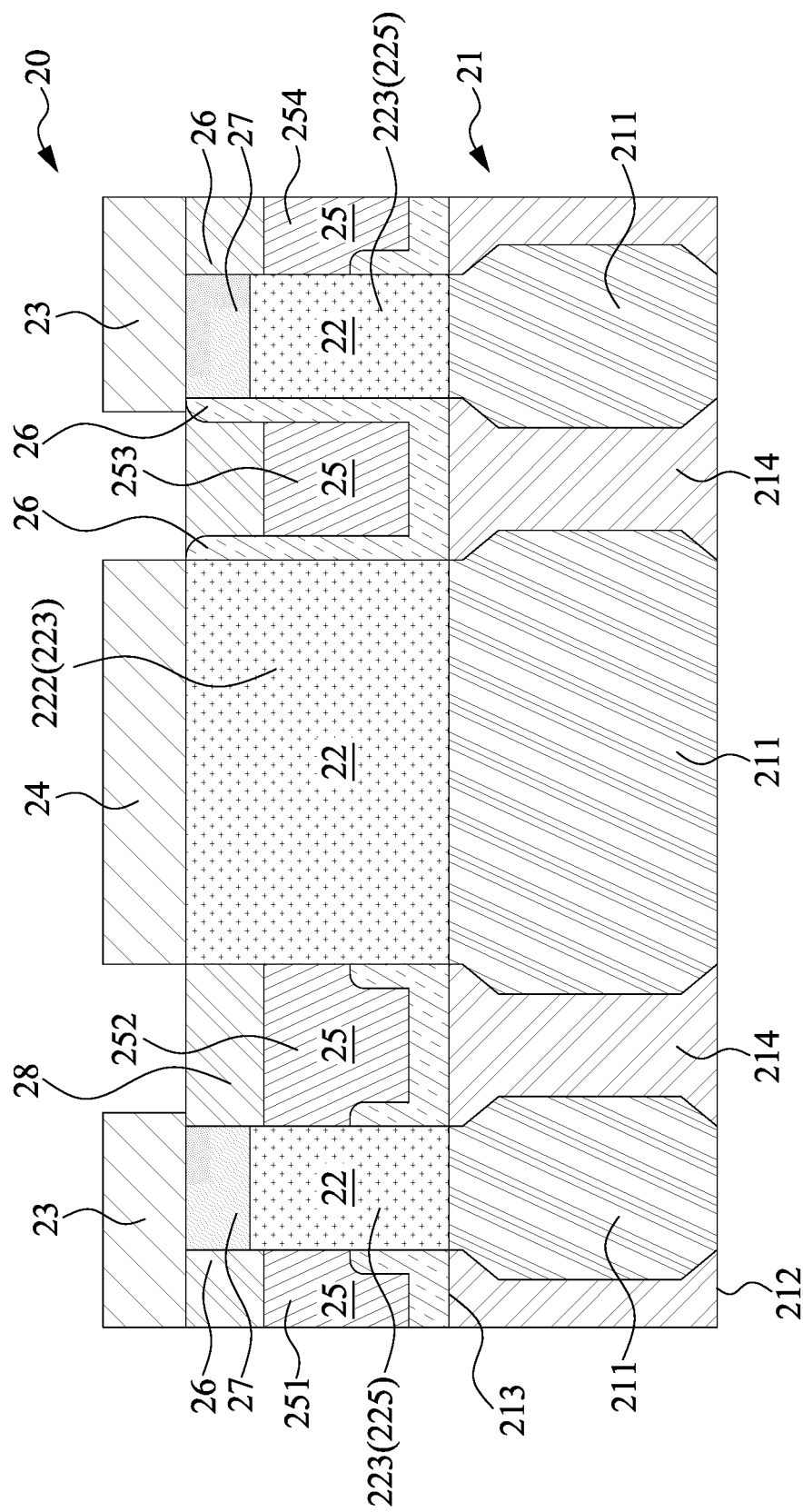
FIG. 7 illustrates a cross sectional view of a semiconductor structure along a cross section line B-B in FIG. 5 in accordance with some embodiments of the present disclosure.

FIG. 5 illustrates a top view of a semiconductor structure in accordance with some embodiments of the present disclosure. FIG. 6 illustrates a cross sectional view of a semiconductor structure along a cross section line A-A in FIG. 5 in accordance with some embodiments of the present disclosure. FIG. 7 illustrates a cross sectional view of a semiconductor structure along a cross section line B-B in FIG. 5 in accordance with some embodiments of the present disclosure. Referring to FIG. 5 to FIG. 7, the semiconductor structure 20 includes an active layer 21, a plurality of metal pillars 22, a plurality of first backside power lines 23, a plurality of second backside power lines 24, a plurality of inner metal lines 25, a plurality of spacers 26 and a plurality of isolation caps 27.

The active layer 21 has a plurality of active regions 211, a front side 212 and a back side 213. The back side 213 is corresponding to the front side 212. In the figures, the semiconductor structure 20 is upside down, and the front side 212 is placed on the bottom of the active layer 21 and the back side 213 is place on the top of the active layer 21. In accordance with some embodiments of the present disclosure, the active regions 211 are configured to be PMOS.

The active layer 21 further includes dielectric fillers 214 disposed between the active regions 211.

The metal pillars 22 are disposed on the active regions 211, and are disposed on the back side 213 of the active layer 21. The metal pillars 22 are electrically connected to the active regions 211. The metal pillars 22 include a first group 221, a second group 222, a third group 223, a fourth group 224, a fifth group 225 and a sixth group 226.

The first backside power lines 23 are disposed on the first group 221 of the metal pillars 22, and extend along a first axis, for example, the first axis is X-axis. The first backside power lines 23 are electrically connected to the first group 221 of the metal pillars 22 and the active regions 211. In accordance with some embodiments of the present disclosure, the first backside power lines 23 may be connected to the logic blocks 113, and may be connected to the second power terminal 115 of PMOS (as shown in FIG. 1).

The second backside power lines 24 are disposed on the second group 222 of the metal pillars 22, and extend along the first axis. The second backside power lines 24 are electrically connected to the second group 222 of the metal pillars 22 and the active regions 211. In accordance with some embodiments of the present disclosure, the second backside power lines 24 may be connected to a power source, and may be connected to the first power terminal 114 of PMOS (as shown in FIG. 1).

The inner metal lines 25 are disposed aside the metal pillars 22, and are electrically connected to the third group 223 of the metal pillars 22 and extend along the first axis. Since the inner metal lines 25 are electrically connected to the third group 223 of the metal pillars 22, the inner metal lines 25 are electrically connected to the first backside power lines 23 or the second backside power lines 23. In accordance with some embodiments of the present disclosure, the inner metal lines 25 include a first inner metal line 251, a second inner metal line 252, a third inner metal line 253 and a fourth inner metal line 254. The first inner metal line 251 and the second inner metal line 252 are electrically connected to the second backside power line 24 by the third group 223 of the metal pillars 22 (as shown in FIG. 7). In FIG. 7, since the second group 222 of the metal pillars 22 is electrically connected to the second backside power line 24 and the active region 211, and the third group 223 of the metal pillars 22 under the second backside power line 24 is electrically connected to the second backside power line 24 and the second inner metal line 252, the third group 223 of the metal pillars 22 under the second backside power line 24 may be the second group 222 of the metal pillars 22. Furthermore, the third inner metal line 253 is electrically connected to the first backside power line 23 by the third group 223 of the metal pillars 22 (as shown in FIG. 6). In FIG. 6, since the first group 221 of the metal pillars 22 is electrically connected to the first backside power line 23 and the active region 211, and the third group 223 of the metal pillars 22 under the first backside power line 23 is electrically connected to the first backside power line 23 and the third inner metal line 253, the third group 223 of the metal pillars 22 under the first backside power line 23 may be the first group 221 of the metal pillars 22. The fourth inner metal line 254 is electrically connected to the second backside power line 24.

The spacers 26 are disposed between the inner metal lines 25 and the fourth group 224 of the metal pillars 22. The spacers 26 may be used to isolate the inner metal lines 25 and the fourth group 224 of the metal pillars 22 so that the inner metal lines 25 may be isolated from the first backside power lines 23 or the second backside power lines 24. In accordance with some embodiments of the present disclosure, the first inner metal line 251 and the second inner metal line 252 are electrically connected to the second backside power line 24, and the spacers 26 are used to isolate the first inner metal line 251 and the second inner metal line 252 from the first backside power line 23 connecting to the fourth group 224 of the metal pillars 22 (as shown in FIG. 6). In FIG. 6, since the first group 221 of the metal pillars 22 is electrically connected to the first backside power line 23 and the active region 211, and the spacers 26 disposed on the two sides of the fourth group 224 of the metal pillars 22 are used to isolate the first inner metal line 251 and the second inner metal line 252 from the first backside power line 23, the fourth group 224 of the metal pillars 22 under the first backside power line 23 may be the first group 221 of the metal pillars 22.

The isolation caps 27 are disposed between the first backside power lines 23 and the fifth group 225 of the metal pillars 22, and are disposed between the second backside power lines 24 and the sixth group 226 of the metal pillars 22. The isolation caps 27 may be used to isolate the inner metal lines 25 from the first backside power lines 23 or the second backside power lines 24. In accordance with some embodiments of the present disclosure, the first inner metal line 251 and the second inner metal line 252 are electrically connected to the second backside power line 24, and the isolation caps 27 are used to isolate the first inner metal line 251 and the second inner metal line 252 from the first backside power line 23 connecting to the fifth group 225 of the metal pillars 22 (as shown in FIG. 7). In FIG. 7, since the third group 223 of the metal pillars 22 is electrically connected to the first inner metal line 251 and the second inner metal line 252, and the isolation caps 27 under the first backside power line 23 are used to isolate the first backside power line 23 from the fifth group 225 of the metal pillars 22, the fifth group 225 of the metal pillars 22 under isolation caps 27 may be the third group 223 of the metal pillars 22. Furthermore, the third inner metal line 253 is electrically connected to the first backside power line 23, and the isolation caps 27 are used to isolate the third inner metal line 253 from the second backside power line 24 connecting to the sixth group 226 of the metal pillars 22 (as shown in FIG. 6). In FIG. 6, since the third group 223 of the metal pillars 22 is electrically connected to the third inner metal line 253, and the isolation cap 27 under the second backside power line 24 is used to isolate the second backside power line 24 from the sixth group 226 of the metal pillars 22, the sixth group 226 of the metal pillars 22 under isolation cap 27 may be the third group 223 of the metal pillars 22.

By using the spacers 26 and the isolation caps 27, the inner metal line 25 may be electrically connected to the first backside power lines 23 or the second backside power lines 24 at the back side 213 of the active layer 21, and electrically connected to the active regions 211 at the back side 213 to implement a back-side power distribution network. Comparing with a front-side power distribution network, the semiconductor structure 20 may maximize the front-side routing source, and may minimize power IR drop impact at the front-side.

In accordance with some embodiments of the present disclosure, the spacers 26 are disposed at least one side of the fourth group 224 of the metal pillars 22. In FIG. 6, since the first group 221 of the metal pillars 22 is electrically connected to the first backside power line 23, and the fourth inner metal line 254 is electrically connected to the second backside power line 24, the space 26 is used to isolate from the fourth group 224 of the metal pillars 22 and the fourth inner metal line 254, and is disposed at one side of the fourth group 224 of the metal pillars 22.

In accordance with some embodiments of the present disclosure, the semiconductor structure 20 further includes an isolation layer 28 disposed on the inner metal lines 25. The isolation layer 28 may further isolate the inner metal lines 25 from the first backside power line 23 or the second backside power line 24.

Figure 8:
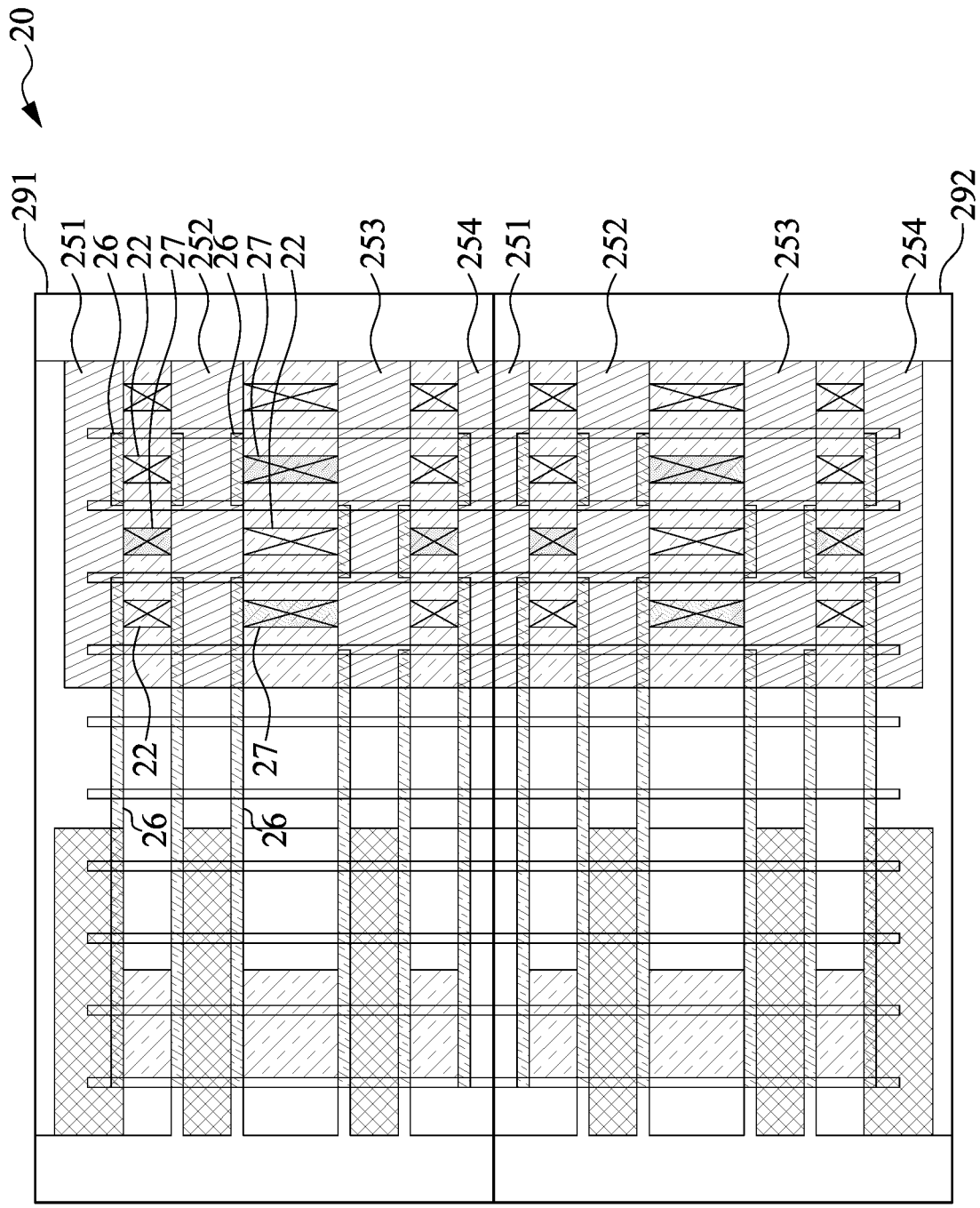
FIG. 8 illustrates a top view of a semiconductor structure in accordance with some embodiments of the present disclosure.

FIG. 8 illustrates a top view of a semiconductor structure in accordance with some embodiments of the present disclosure. Referring to FIG. 8, the semiconductor structure 20 further includes a plurality of cells 291, 292 arranged along a second axis, the second axis being vertical to the first axis, for example, the second axis is Y-axis. In accordance with some embodiments of the present disclosure, the cells 291, 292 may achieve the function of a circuit, for example, the header circuit 11 shown in FIG. 1. The cells 291, 292 may be configured to be first power gating cells. The first power gating cell includes a plurality of PMOS transistors, and the first power gating cells are adjacent to each other along the second axis. In accordance with some embodiments of the present disclosure, each cell 291 has the first inner metal line 251, the second inner metal line 252, the third inner metal line 253 and the fourth inner metal line 254. The first inner metal line 251 and the second inner metal line 252 are electrically connected to the second backside power line 24, the third inner metal line 253 is electrically connected to the first backside power line 23, and the fourth inner metal line 254 is electrically connected to the second backside power line 24. In accordance with some embodiments of the present disclosure, each cell 291 shares at least the first inner metal line 251 and the fourth inner metal line 254 with at least one adjacent cell. For example, the fourth inner metal line 254 of the cell 291 is electrically connected to the first inner metal line 251 of the cell 292, and the fourth inner metal line 254 of the cell 291 may be the same as the first inner metal line 251 of the cell 292, that is the cells 291, 292 share the first inner metal line 251 and the fourth inner metal line 254. Therefore, the first inner metal line 251 may provide the second backside power line 24 to the fourth inner metal line 254.

Figure 9:
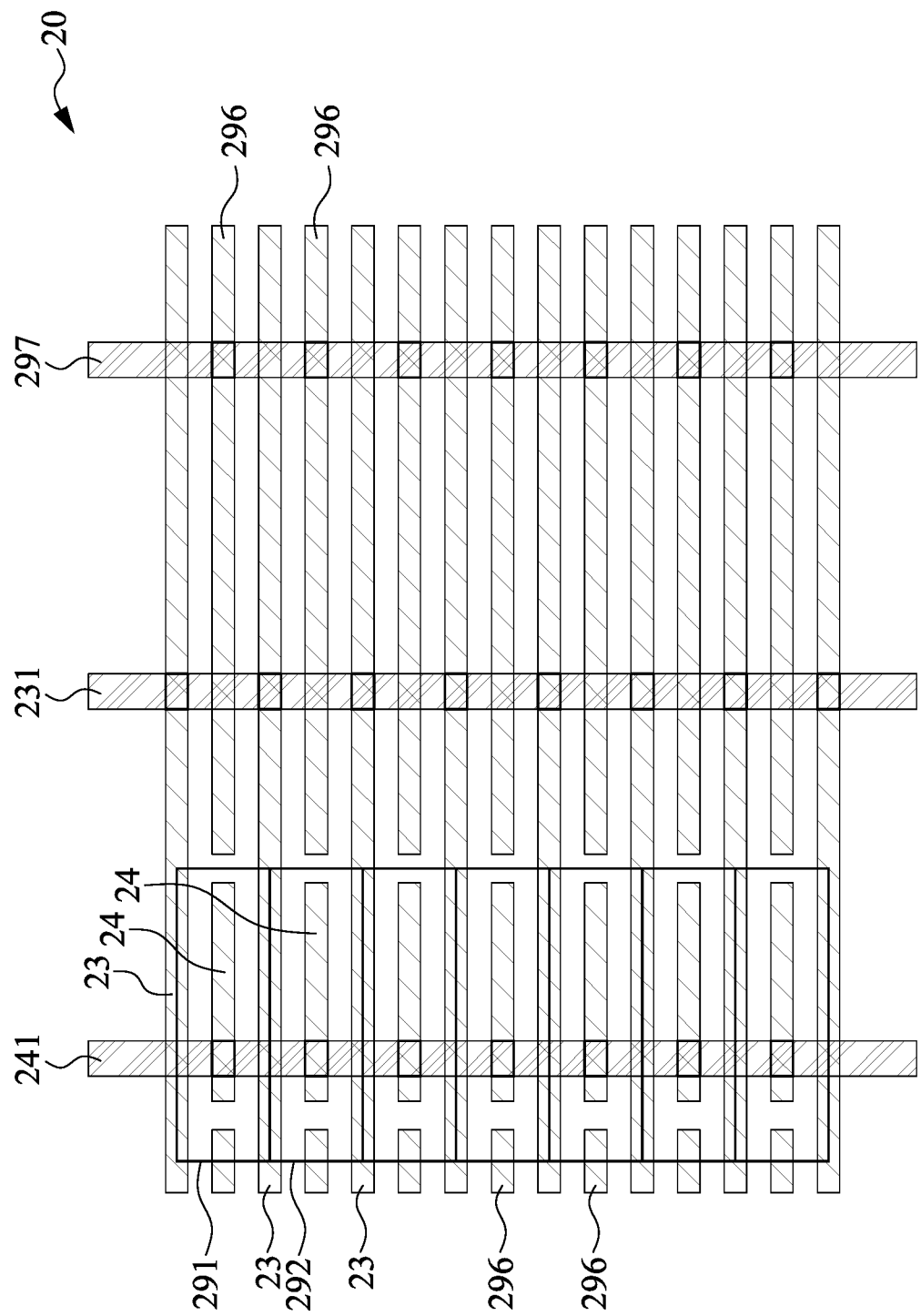
FIG. 9 illustrates a schematic diagram of a semiconductor structure in accordance with some embodiments of the present disclosure.

FIG. 9 illustrates a schematic diagram of a semiconductor structure in accordance with some embodiments of the present disclosure. Referring to FIG. 9, the semiconductor structure 20 includes a plurality of cells 291, 292. Each cell has two first backside power lines 23 and one second backside power line 24, and the second backside power line 24 is disposed between the two first backside power lines 23. For brevity, only the first backside power lines 23 and the second backside power lines 24 of the semiconductor structure 20 are shown in FIG. 9. In accordance with some embodiments of the present disclosure, each cell shares at least one first backside power line with at least one adjacent cell. For example, the lower first backside power line 23 of the cell 291 may be the same as the upper first backside power lines 23 of the cell 292, that is the cells 291, 292 share the first backside power line 23 disposed between the cells 291, 292.

In accordance with some embodiments of the present disclosure, the semiconductor structure 20 further includes a plurality of third backside power lines 296. The third backside power lines 296 may be electrically connected to a ground. In accordance with some embodiments of the present disclosure, the semiconductor structure 20 further includes a first connection line 231, a second connection line 241 and a third connection line 297. The first connection line 231, the second connection line 241 and the third connection line 297 extend along the second axis. The first connection line 231, the second connection line 241 and the third connection line 297 may be disposed on a metal one (M1) layer on the back side of the semiconductor structure 20. The first connection line 231 is electrically connected to the first backside power lines 23. The second connection line 241 is electrically connected to the second backside power lines 24. The third connection line 297 is electrically connected to the third backside power lines 296.

Figure 10:
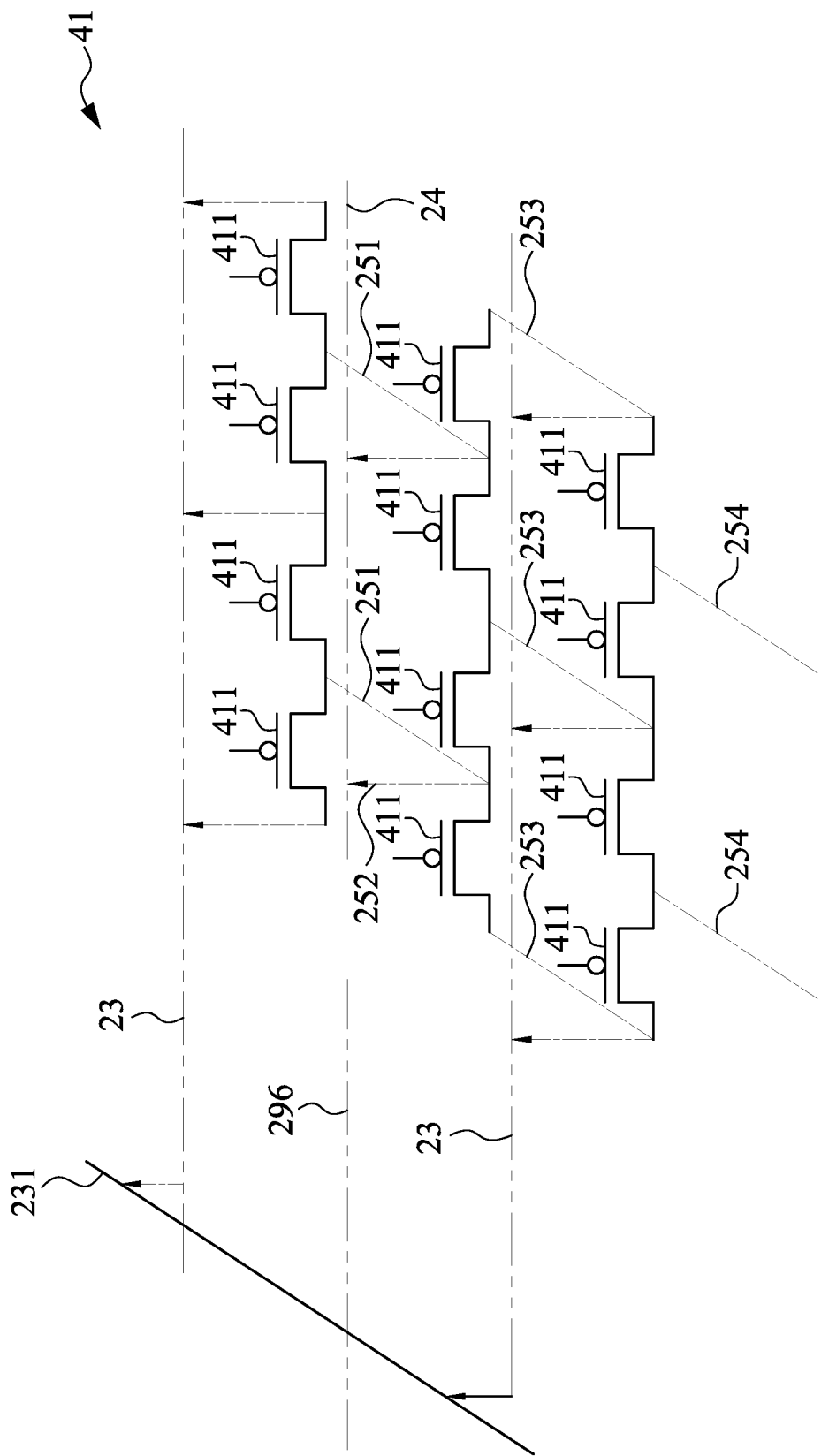
FIG. 10 illustrates a PMOS circuit in accordance with some embodiments of the present disclosure.

FIG. 10 illustrates a PMOS circuit in accordance with some embodiments of the present disclosure. Referring to FIG. 10, a PMOS circuit 41 includes a plurality of PMOS transistors 411. The PMOS transistors 411 are used as a switch, and may be equivalent to one PMOS transistor 111 as shown in FIG. 1. The PMOS circuit 41 may be implemented by part of the cell 291 of the semiconductor structure 20. In accordance with some embodiments of the present disclosure, the PMOS transistors 411 may be implemented by the active regions 211. The first backside power lines 23 are electrically connected to the first power terminals of the PMOS transistors 311, and the second backside power lines 24 are electrically connected to the second power terminals of the PMOS transistors 411. The first inner metal line 251 and the second inner metal line 252 are electrically connected to the second backside power line 24. The third inner metal line 253 is electrically connected to the first backside power line 23. The fourth inner metal line 254 is electrically connected to the second backside power line 24 by the first inner metal line 251 of the adjacent cell 292 as shown in FIG. 8.

Figure 11:
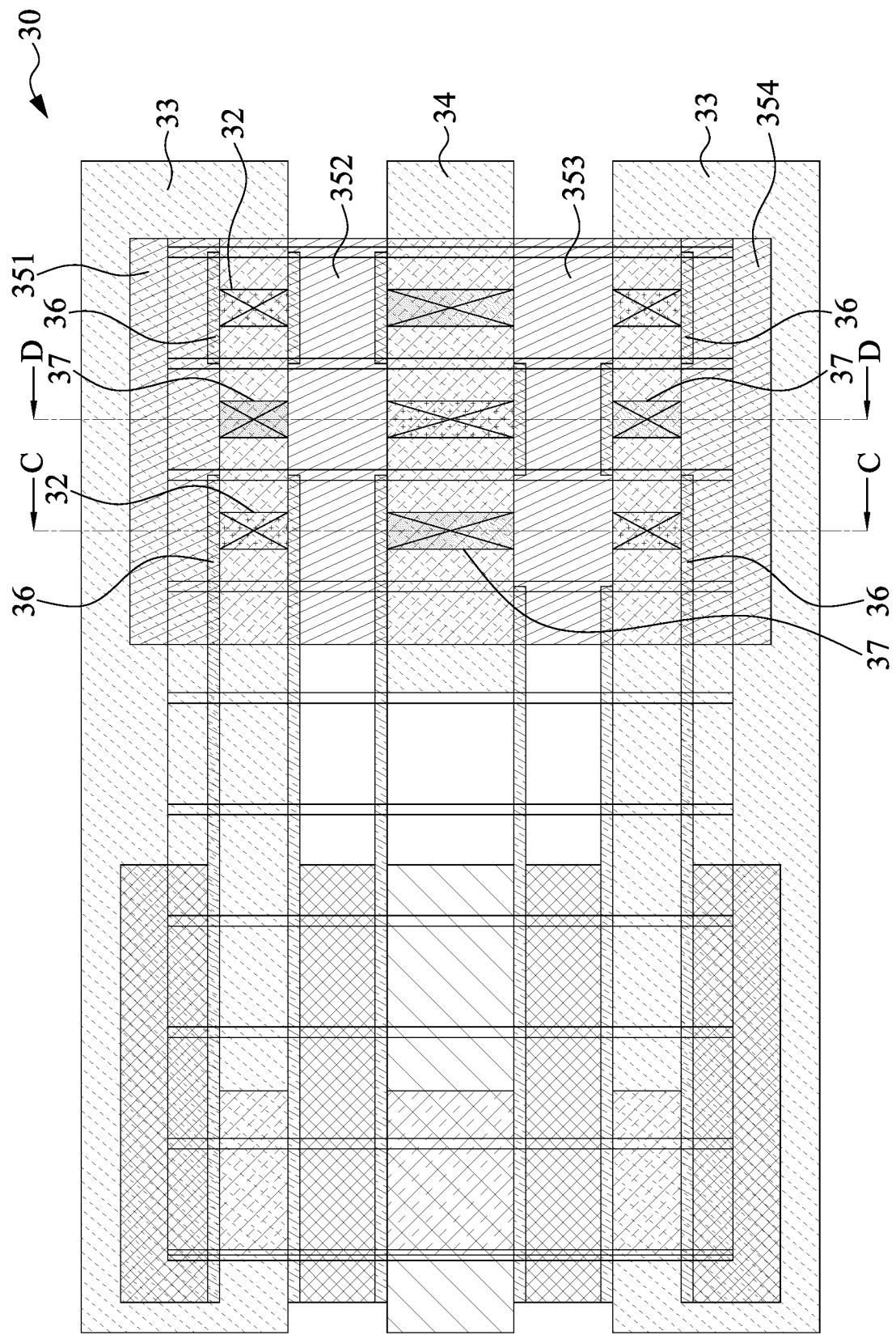
FIG. 11 illustrates a top view of a semiconductor structure in accordance with some embodiments of the present disclosure.
Figure 12:
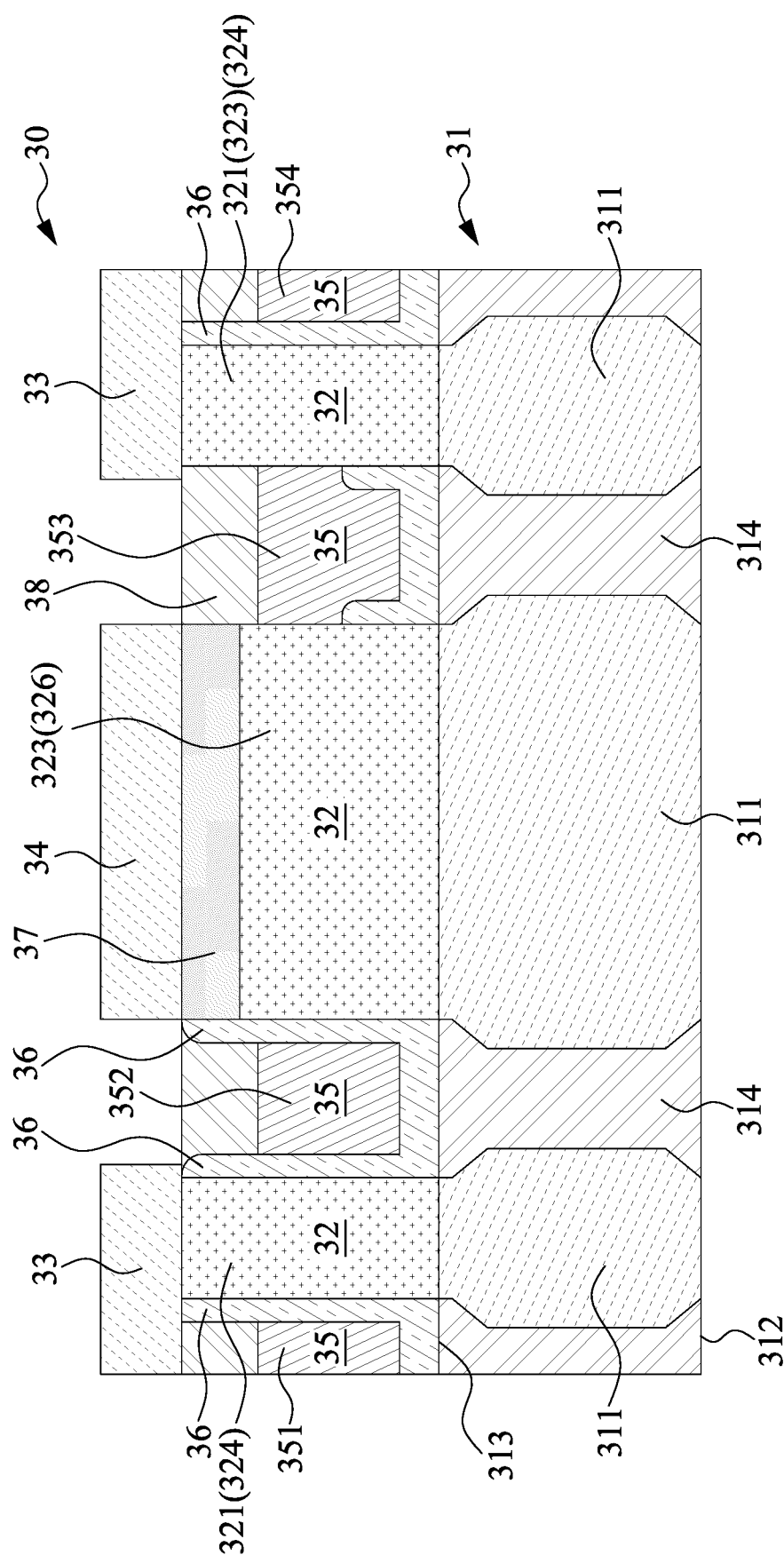
FIG. 12 illustrates a cross sectional view of a semiconductor structure along a cross section line C-C in FIG. 11 in accordance with some embodiments of the present disclosure.
Figure 13:
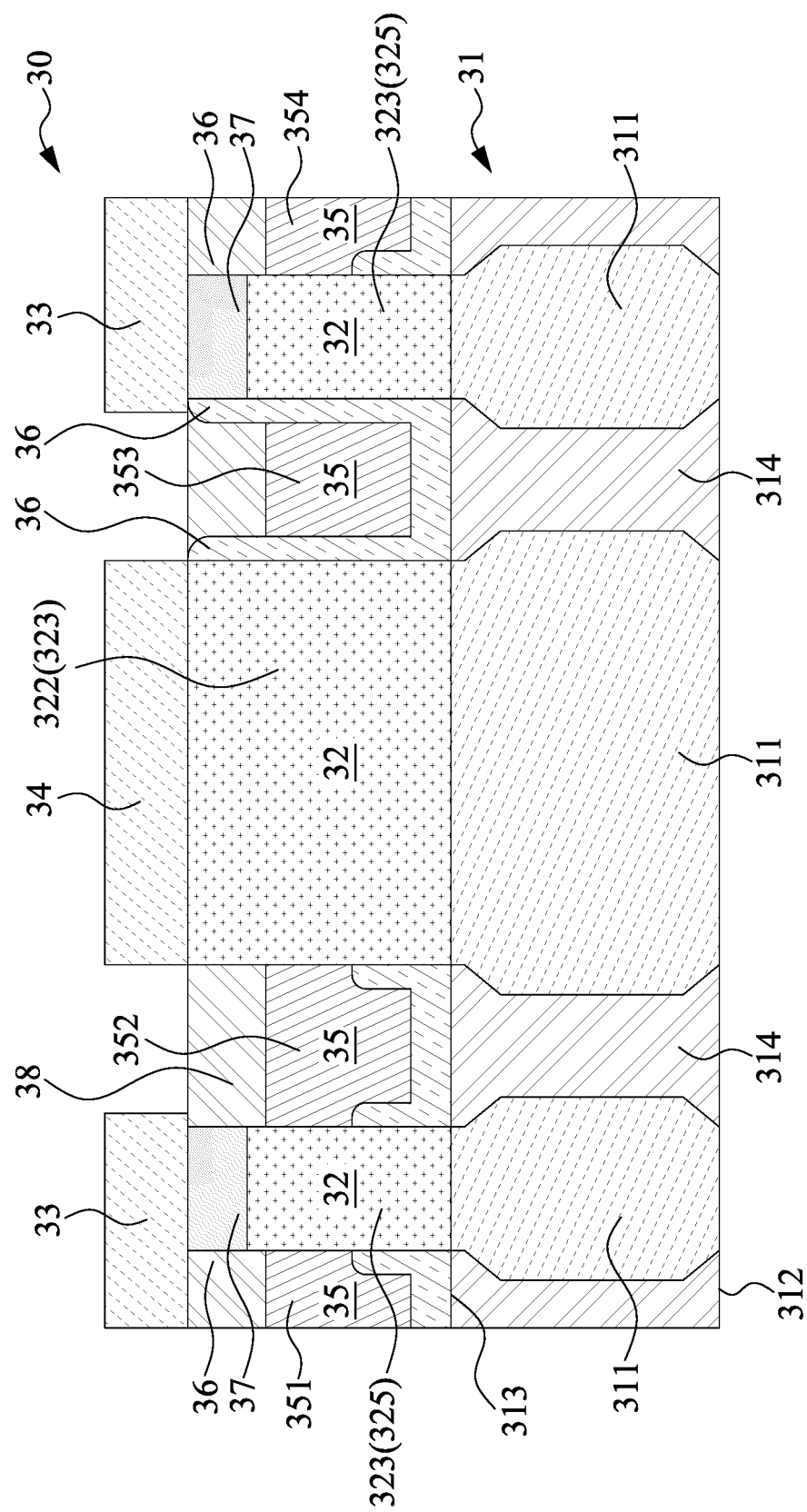
FIG. 13 illustrates a cross sectional view of a semiconductor structure along a cross section line D-D in FIG. 11 in accordance with some embodiments of the present disclosure.

FIG. 11 illustrates a top view of a semiconductor structure in accordance with some embodiments of the present disclosure. FIG. 12 illustrates a cross sectional view of a semiconductor structure along a cross section line C-C in FIG. 11 in accordance with some embodiments of the present disclosure. FIG. 13 illustrates a cross sectional view of a semiconductor structure along a cross section line D-D in FIG. 11 in accordance with some embodiments of the present disclosure. Referring to FIG. 11 to FIG. 13, the semiconductor structure 30 includes an active layer 31, a plurality of metal pillars 32, a plurality of first backside power lines 33, a plurality of second backside power lines 34, a plurality of inner metal lines 35, a plurality of spacers 36 and a plurality of isolation caps 37.

The active layer 31 has a plurality of active regions 311, a front side 312 and a back side 313. The back side 313 is corresponding to the front side 312. In the figures, the semiconductor structure 30 is upside down, and the front side 312 is placed on the bottom of the active layer 31 and the back side 313 is place on the top of the active layer 21. In accordance with some embodiments of the present disclosure, the active regions 311 are configured to be NMOS. The active layer 31 further includes dielectric fillers 314 disposed between the active regions 311.

The metal pillars 32 are disposed on the active regions 311, and are disposed on the back side 313 of the active layer 31. The metal pillars 32 are electrically connected to the active regions 311. The metal pillars 32 include a first group 321, a second group 322, a third group 323, a fourth group 324, a fifth group 325 and a sixth group 326.

The first backside power lines 33 are disposed on the first group 321 of the metal pillars 32, and extend along the first axis. The first backside power lines 33 are electrically connected to the first group 321 of the metal pillars 32 and the active regions 311. In accordance with some embodiments of the present disclosure, the first backside power lines 33 may be connected to the logic blocks 123, and may be connected to the second power terminal 125 of NMOS (as shown in FIG. 2).

The second backside power lines 34 are disposed on the second group 322 of the metal pillars 32, and extend along the first axis. The second backside power lines 33 are electrically connected to the second group 322 of the metal pillars 32 and the active regions 311. In accordance with some embodiments of the present disclosure, the second backside power lines 34 may be connected to a ground, and may be connected to the first power terminal 124 of NMOS (as shown in FIG. 2).

The inner metal lines 35 are disposed aside the metal pillars 32, and are electrically connected to the third group 323 of the metal pillars 32 and extend along the first axis. Since the inner metal lines 35 are electrically connected to the third group 323 of the metal pillars 32, the inner metal lines 35 are electrically connected to the first backside power lines 33 or the second backside power lines 33. In accordance with some embodiments of the present disclosure, the inner metal lines 35 include a first inner metal line 351, a second inner metal line 352, a third inner metal line 353 and a fourth inner metal line 354. The first inner metal line 351 and the second inner metal line 352 are electrically connected to the second backside power line 34 by the third group 323 of the metal pillars 32 (as shown in FIG. 13). The third inner metal line 353 is electrically connected to the first backside power line 33 by the third group 323 of the metal pillars 32 (as shown in FIG. 12).

The spacers 36 are disposed between the inner metal lines 35 and the fourth group 324 of the metal pillars 32. The spacers 36 may be used to isolate the inner metal lines 35 and the fourth group 324 of the metal pillars 32 so that the inner metal lines 35 may be isolated from the first backside power lines 33 or the second backside power lines 34. In accordance with some embodiments of the present disclosure, the first inner metal line 351 and the second inner metal line 352 are electrically connected to the second backside power line 34, and the spacers 36 are used to isolate the first inner metal line 351 and the second inner metal line 352 from the first backside power line 33 connecting to the fourth group 324 of the metal pillars 32 (as shown in FIG. 12).

The isolation caps 37 are disposed between the first backside power lines 33 and the fifth group 325 of the metal pillars 32, and are disposed between the second backside power lines 34 and the sixth group 326 of the metal pillars 32. The isolation caps 37 may be used to isolate the inner metal lines 35 from the first backside power lines 33 or the second backside power lines 34. In accordance with some embodiments of the present disclosure, the first inner metal line 351 and the second inner metal line 352 are electrically connected to the second backside power line 34, and the isolation caps 37 are used to isolate the first inner metal line 351 and the second inner metal line 352 from the first backside power line 33 connecting to the fifth group 325 of the metal pillars 32 (as shown in FIG. 13). The third inner metal line 353 is electrically connected to the first backside power line 33, and the isolation caps 37 are used to isolate the third inner metal line 353 from the second backside power line 34 connecting to the sixth group 326 of the metal pillars 32 (as shown in FIG. 12).

By using the spacers 36 and the isolation caps 37, the inner metal line 35 may be electrically connected to the first backside power lines 33 or the second backside power lines 34 at the back side 313 of the active layer 31, and electrically connected to the active regions 311 at the back side 313 to implement a back-side power distribution network. Comparing with a front-side power distribution network, the semiconductor structure 30 may maximize the front-side routing source, and may minimize power IR drop impact at the front-side.

In accordance with some embodiments of the present disclosure, the spacers 36 are disposed at least one side of the fourth group 324 of the metal pillars 32. In FIG. 12, since the first group 321 of the metal pillars 32 is electrically connected to the first backside power line 33, and the fourth inner metal line 354 is electrically connected to the second backside power line 34, the space 36 is used to isolate from the fourth group 324 of the metal pillars 32 and the fourth inner metal line 354, and is disposed at one side of the fourth group 324 of the metal pillars 32.

In accordance with some embodiments of the present disclosure, the semiconductor structure 30 further includes an isolation layer 38 disposed on the inner metal lines 35. The isolation layer 38 may further isolate the inner metal lines 35 from the first backside power line 33 or the second backside power line 34.

Figure 14:
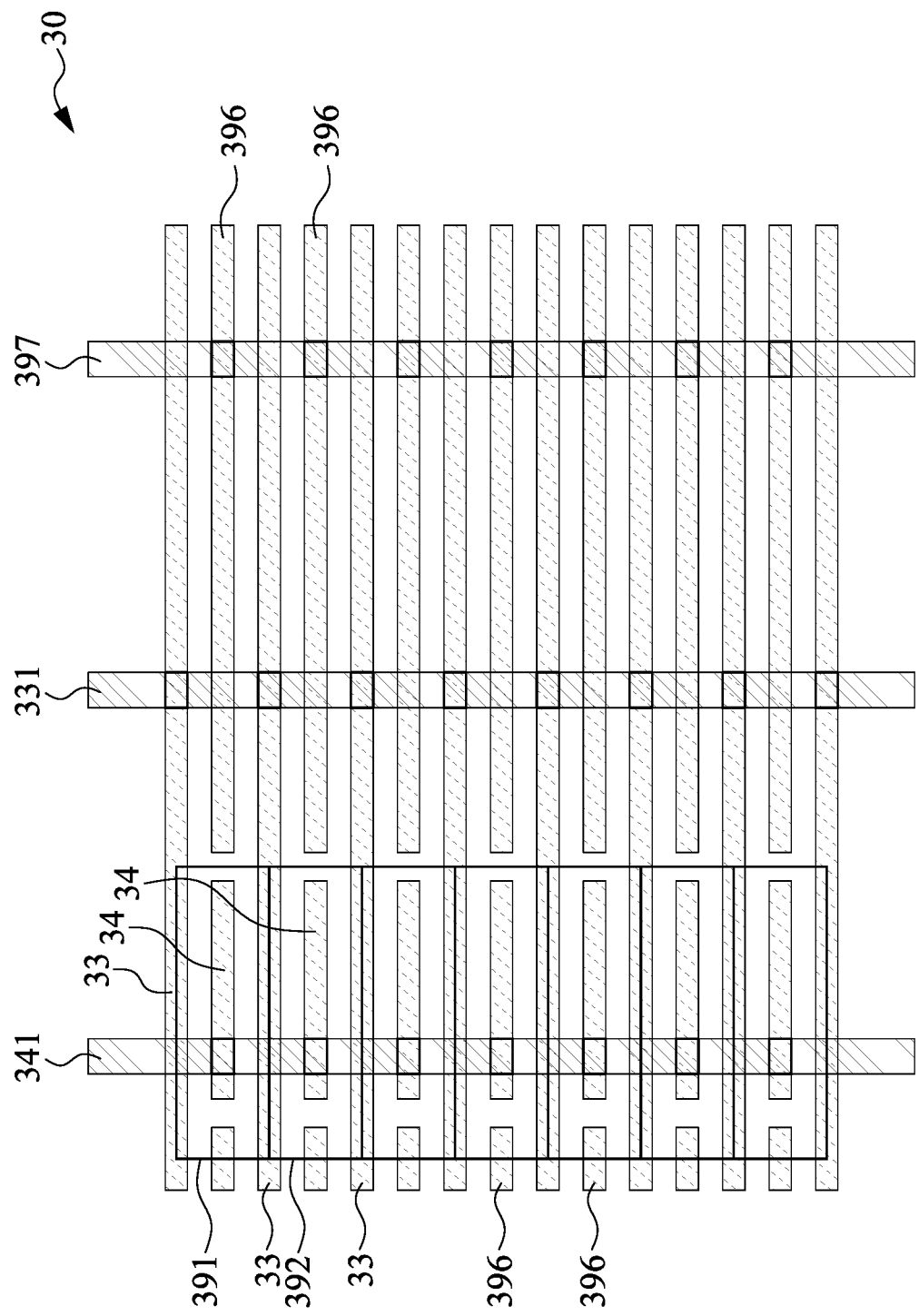
FIG. 14 illustrates a schematic diagram of a semiconductor structure in accordance with some embodiments of the present disclosure.

FIG. 14 illustrates a schematic diagram of a semiconductor structure in accordance with some embodiments of the present disclosure. Referring to FIG. 14, the semiconductor structure 30 further includes a plurality of cells 391, 392. The cells 391, 392 may achieve the function of a circuit, for example, the footer circuit 12 shown in FIG. 2. The cells 391, 392 may be configured to be second power gating cells. The second power gating cell includes a plurality of NMOS transistors, and the second power gating cells are adjacent to each other along the second axis. Each cell has two first backside power lines 33 and one second backside power line 34, and the second backside power line 34 is disposed between the two first backside power lines 33. For brevity, only the first backside power lines 33 and the second backside power lines 34 of the semiconductor structure 30 are shown in FIG. 14. In accordance with some embodiments of the present disclosure, each cell shares at least one first backside power line with at least one adjacent cell. For example, the lower first backside power line 33 of the cell 391 may be the same as the upper first backside power lines 33 of the cell 392, that is the cells 391, 392 share the first backside power line 33 disposed between the cells 391, 392.

In accordance with some embodiments of the present disclosure, the semiconductor structure 30 further includes a plurality of third backside power lines 396. The third backside power lines 396 may be electrically connected to a power source. In accordance with some embodiments of the present disclosure, the semiconductor structure 30 further includes a first connection line 331, a second connection line 341 and a third connection line 397. The first connection line 331, the second connection line 341 and the third connection line 397 extend along the second axis. The first connection line 331, the second connection line 341 and the third connection line 397 may be disposed on a metal one (M1) layer on the back side of the semiconductor structure 30. The first connection line 331 is electrically connected to the first backside power lines 33. The second connection line 341 is electrically connected to the second backside power lines 34. The third connection line 397 is electrically connected to the third backside power lines 396.

Figure 15:
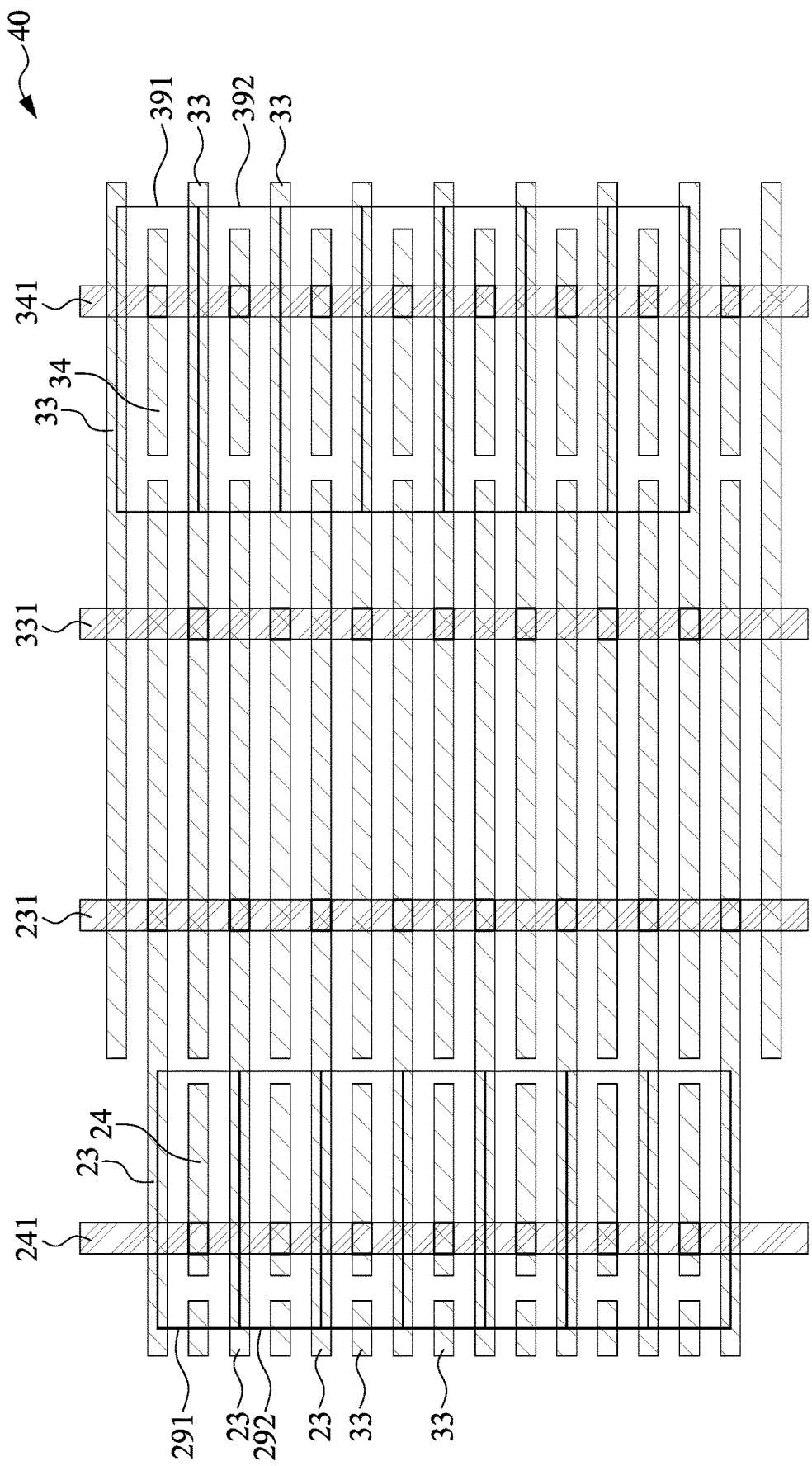
FIG. 15 illustrates a schematic diagram of a semiconductor structure in accordance with some embodiments of the present disclosure.

FIG. 15 illustrates a schematic diagram of a semiconductor structure in accordance with some embodiments of the present disclosure. Referring to FIG. 15, the semiconductor structure 40 further includes a plurality of first cells 291, 292 and second cells 391, 392. The cells 291, 292 may achieve the function of a circuit, for example, the header circuit 11 shown in FIG. 1. The cells 391, 392 may achieve the function of a circuit, for example, the footer circuit 12 shown in FIG. 2. That is, the semiconductor structure 40 utilizes the first cells 291, 292 and the second cells 391, 392 to achieve the two functions of the header circuit 11 and the footer circuit 12.

Figure 16:
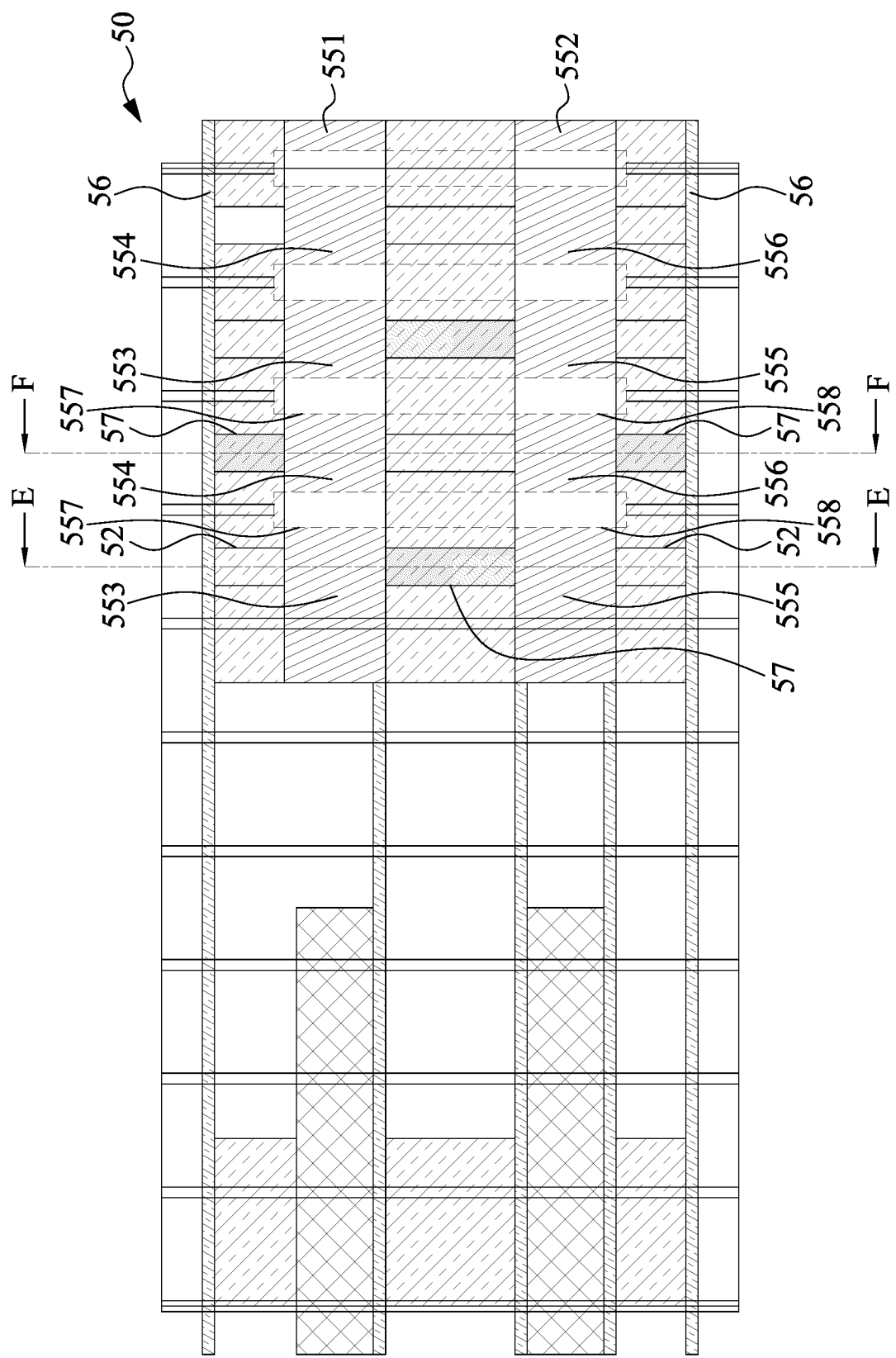
FIG. 16 illustrates a top view of a semiconductor structure in accordance with some embodiments of the present disclosure.
Figure 17:
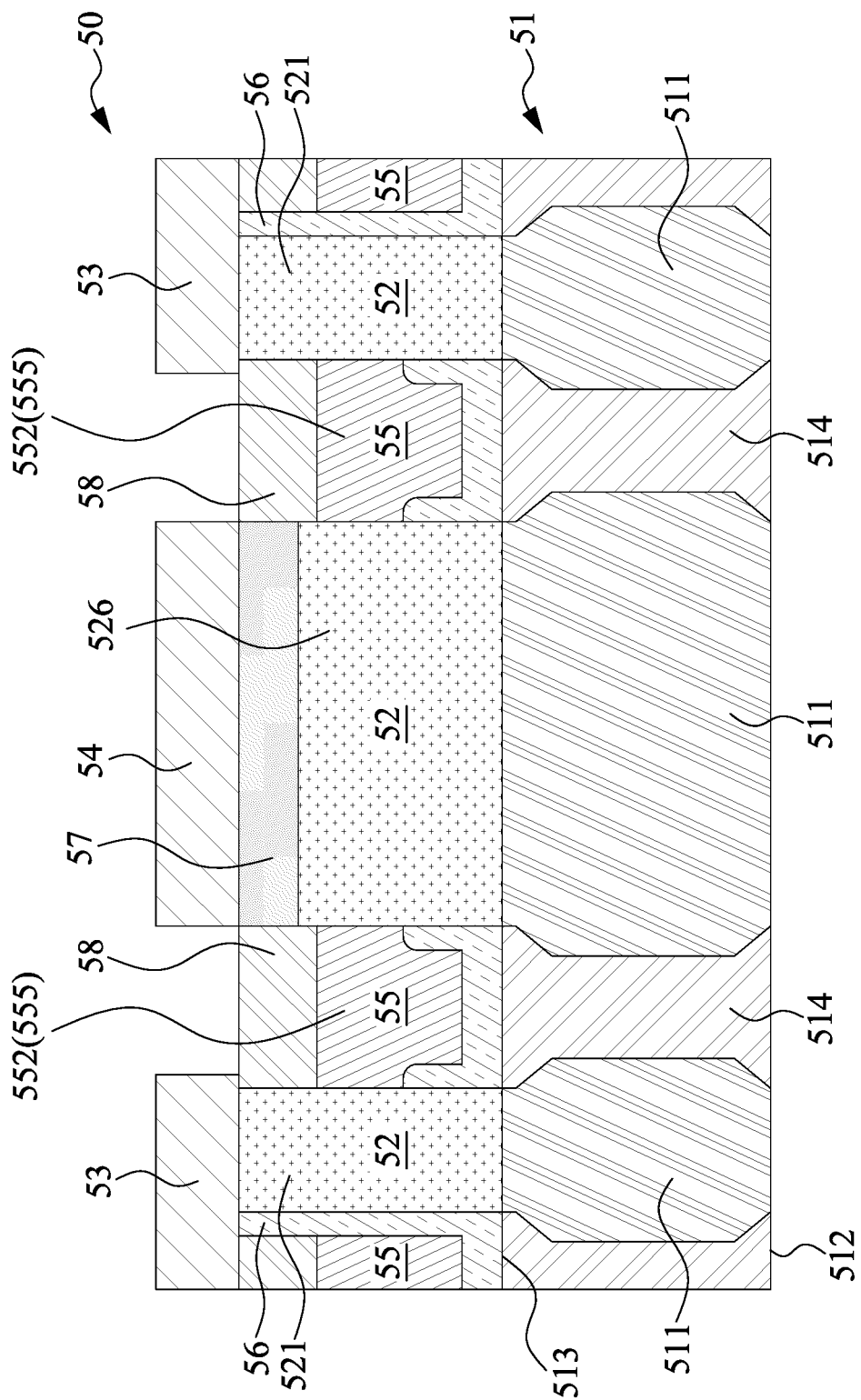
FIG. 17 illustrates a cross sectional view of a semiconductor structure along a cross section line E-E in FIG. 16 in accordance with some embodiments of the present disclosure.
Figure 18:
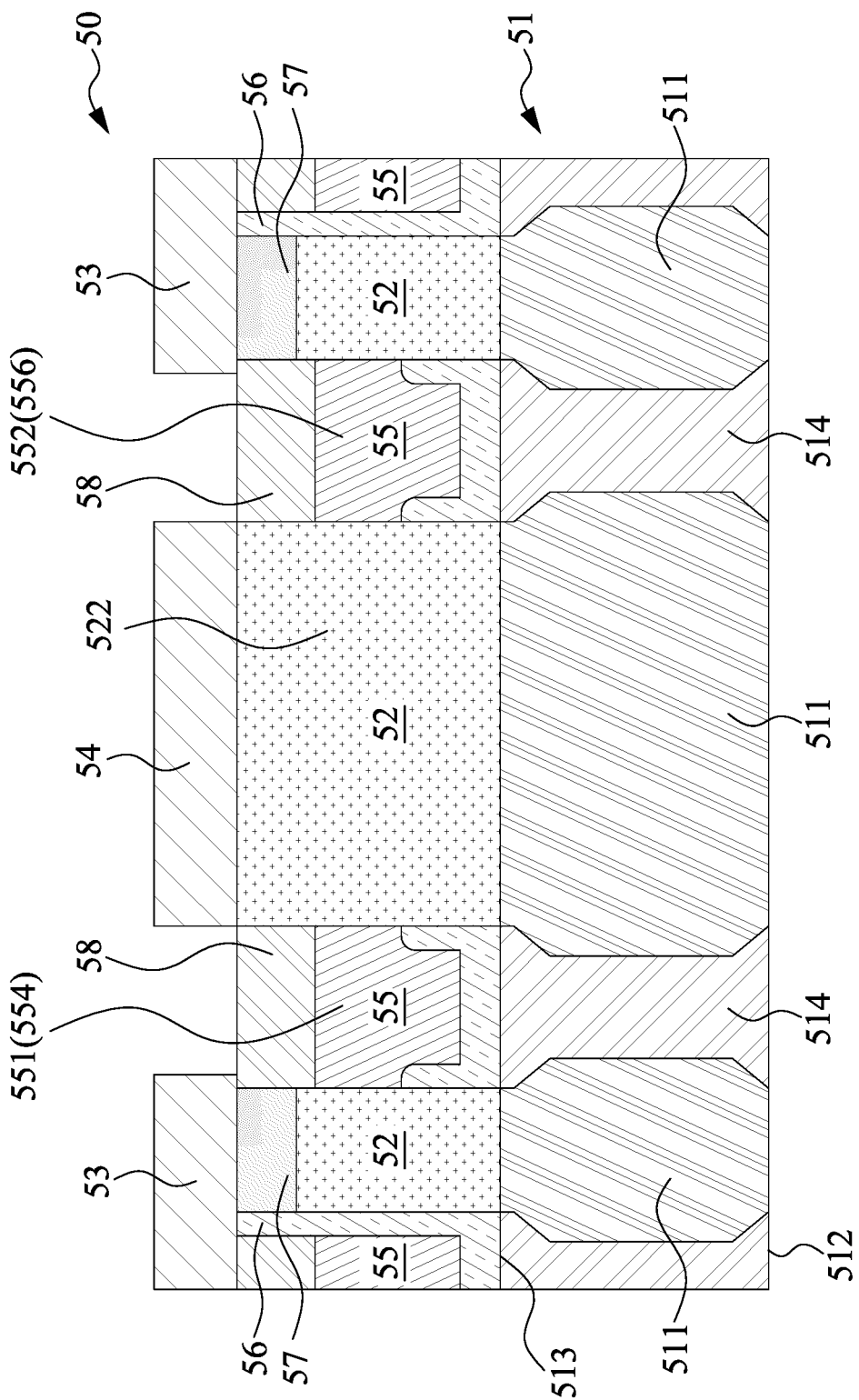
FIG. 18 illustrates a cross sectional view of a semiconductor structure along a cross section line F-F in FIG. 16 in accordance with some embodiments of the present disclosure.

FIG. 16 illustrates a top view of a semiconductor structure in accordance with some embodiments of the present disclosure. FIG. 17 illustrates a cross sectional view of a semiconductor structure along a cross section line E-E in FIG. 16 in accordance with some embodiments of the present disclosure. FIG. 18 illustrates a cross sectional view of a semiconductor structure along a cross section line F-F in FIG. 16 in accordance with some embodiments of the present disclosure. Referring to FIG. 16 to FIG. 18, the semiconductor structure 50 includes an active layer 51, a plurality of metal pillars 52, a plurality of first backside power lines 53, a plurality of second backside power lines 54, a plurality of inner metal lines 55, a plurality of spacers 56 and a plurality of isolation caps 57.

The active layer 51 has a plurality of active regions 511, a front side 512 and a back side 513. The back side 513 is corresponding to the front side 212. In the figures, the semiconductor structure 50 is upside down, and the front side 512 is placed on the bottom of the active layer 51 and the back side 513 is place on the top of the active layer 51. In accordance with some embodiments of the present disclosure, the active regions 511 are configured to be PMOS. The active layer 51 further includes dielectric fillers 514 disposed between the active regions 511.

The metal pillars 52 are disposed on the active regions 511, and are disposed on the back side 513 of the active layer 51. The metal pillars 52 are electrically connected to the active regions 511. The metal pillars 52 include a first group 521, a second group 522, a fifth group 525 and a sixth group 526.

The first backside power lines 53 are disposed on the first group 521 of the metal pillars 52, and extend along the first axis. The first backside power lines 53 are electrically connected to the first group 521 of the metal pillars 52 and the active regions 511. In accordance with some embodiments of the present disclosure, the first backside power lines 53 may be connected to the logic blocks 113, and may be connected to the second power terminal 115 of PMOS (as shown in FIG. 1).

The second backside power lines 54 are disposed on the second group 522 of the metal pillars 52, and extend along the first axis. The second backside power lines 53 are electrically connected to the first group 521 of the metal pillars 52 and the active regions 511. In accordance with some embodiments of the present disclosure, the second backside power lines 54 may be connected to a power source, and may be connected to the first power terminal 114 of PMOS (as shown in FIG. 1).

The inner metal lines 55 are disposed aside the metal pillars 52, and are electrically connected to the metal pillars 52 and extend along the first axis. In accordance with some embodiments of the present disclosure, the inner metal lines 55 include a first inner metal line 551 and a second inner metal line 552 in one cell. The first inner metal line 551 includes a plurality of first inner metal sections 553 and a plurality of second inner metal sections 554. The first inner metal sections 553 are electrically connected to the first backside power line 53, and the second inner metal sections 554 are electrically connected to the second backside power line 54. The first inner metal sections 553 and the second inner metal sections 554 are alternately disposed. The second inner metal line 552 includes a plurality of third inner metal sections 555 and a plurality of fourth inner metal sections 556. The third inner metal sections 555 are electrically connected to the first backside power line 53, and the fourth inner metal sections 556 are electrically connected to the second backside power line 54. The third inner metal sections 555 and the fourth inner metal sections 556 are alternately disposed. In accordance with some embodiments of the present disclosure, each inner metal line has a plurality of cut portions. The first inner metal line 551 has a plurality of cut portions 557, and the second inner metal line 552 has a plurality of cut portions 558. The cut portions 557 are disposed between the first inner metal sections 553 and the second inner metal sections 554 to isolate the first inner metal sections 553 and the second inner metal sections 554. The cut portions 558 are disposed between the third inner metal sections 555 and the fourth inner metal sections 556 to isolate the third inner metal sections 555 and the fourth inner metal sections 556.

In accordance with some embodiments of the present disclosure, each cell has two spacer strips disposed on two peripheral sides of the cell. The spacers 56 are disposed on two peripheral sides of the cell, and disposed on ones side of the peripheral metal pillars 52.

The isolation caps 57 are disposed between the first backside power lines 53 and the fifth group 525 of the metal pillars 52, and are disposed between the second backside power lines 54 and the sixth group 526 of the metal pillars 52. The isolation caps 57 may be used to isolate the inner metal lines 55 from the first backside power lines 53 or the second backside power lines 54. In accordance with some embodiments of the present disclosure, the first inner metal sections 553 and the third inner metal sections 555 are electrically connected to the first backside power line 53, and the isolation caps 57 are used to isolate the first inner metal sections 553 and the third inner metal sections 555 from the second backside power line 54 connecting to the sixth group 526 of the metal pillars 52 (as shown in FIG. 17). The second inner metal sections 554 and the fourth inner metal sections 556 are electrically connected to the second backside power line 54, and the isolation caps 57 are used to isolate the second inner metal sections 554 and the fourth inner metal sections 556 from the first backside power line 53 connecting to the fifth group 525 of the metal pillars 52 (as shown in FIG. 18).

By using the isolation caps 57 and the cut portions 557, 558, the inner metal line 55 may be electrically connected to the first backside power lines 53 or the second backside power lines 54 at the back side 513 of the active layer 51, and electrically connected to the active regions 511 at the back side 513 to implement a back-side power distribution network. Comparing with a front-side power distribution network, the semiconductor structure 50 may maximize the front-side routing source, and may minimize power IR drop impact at the front-side.

In accordance with some embodiments of the present disclosure, the semiconductor structure 50 further includes an isolation layer 58 disposed on the inner metal lines 55. The isolation layer 58 may further isolate the inner metal lines 55 from the first backside power line 53 or the second backside power line 54.

Figure 19:
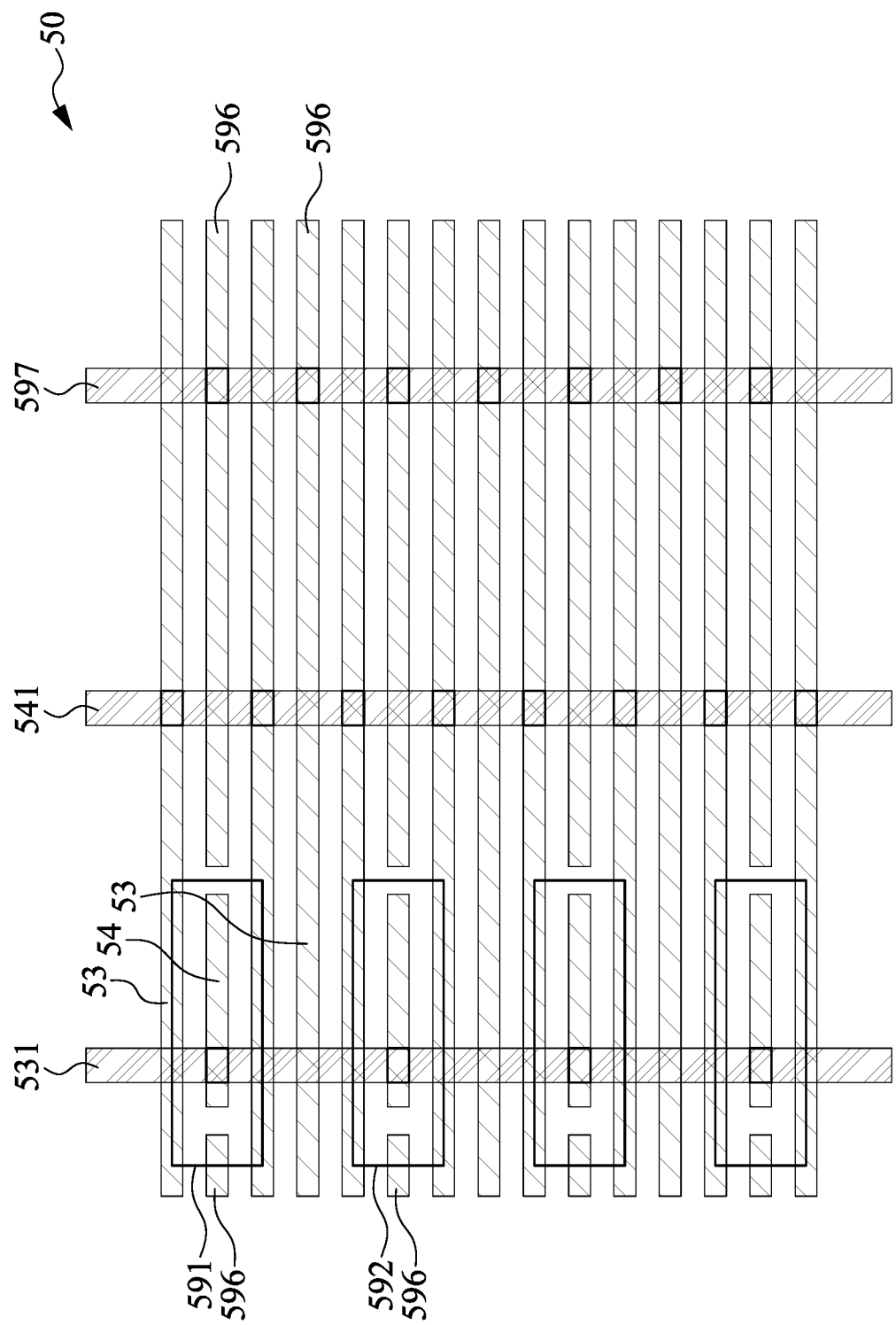
FIG. 19 illustrates a schematic diagram of a semiconductor structure in accordance with some embodiments of the present disclosure.

FIG. 19 illustrates a schematic diagram of a semiconductor structure in accordance with some embodiments of the present disclosure. Referring to FIG. 19, the semiconductor structure 50 further includes a plurality of cells 591, 592 arranged along the second axis. In accordance with some embodiments of the present disclosure, the cells 591, 592 may achieve the function of a circuit, for example, the header circuit 11 shown in FIG. 1. The cells 591, 592 may be configured to be first power gating cells. The first power gating cell includes a plurality of PMOS transistors. Each cell has two first backside power lines 53 and one second backside power line 54, and the second backside power line 54 is disposed between the two first backside power lines 53. For brevity, only the first backside power lines 53 and the second backside power lines 54 of the semiconductor structure 50 are shown in FIG. 19. In accordance with some embodiments of the present disclosure, the cells 591, 592 are alternately disposed along the second axis, and a distance is disposed between the two cells 591, 592. The cells 591, 592 do not share the first backside power line 53.

In accordance with some embodiments of the present disclosure, the semiconductor structure 50 further includes a plurality of third backside power lines 596. The third backside power lines 596 may be electrically connected to a ground. In accordance with some embodiments of the present disclosure, the semiconductor structure 50 further includes a first connection line 531, a second connection line 541 and a third connection line 597. The first connection line 531, the second connection line 541 and the third connection line 597 extend along the second axis. The first connection line 531, the second connection line 541 and the third connection line 597 may disposed on a metal one (M1) layer on the back side of the semiconductor structure 50. The first connection line 531 is electrically connected to the first backside power lines 53. The second connection line 541 is electrically connected to the second backside power lines 54. The third connection line 597 is electrically connected to the third backside power lines 596.

Figure 20:
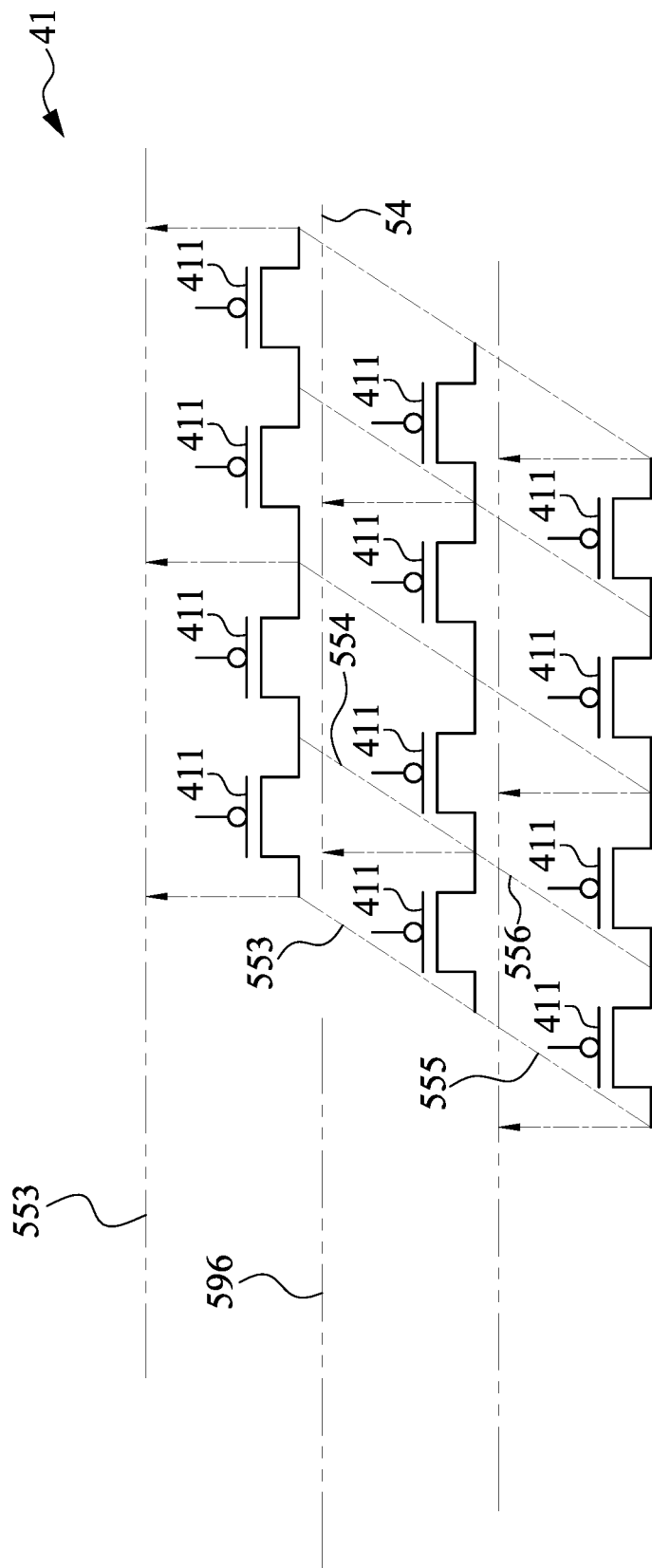
FIG. 20 illustrates a PMOS circuit in accordance with some embodiments of the present disclosure.

FIG. 20 illustrates a PMOS circuit in accordance with some embodiments of the present disclosure. Referring to FIG. 20, a PMOS circuit 41 includes a plurality of PMOS transistors 411. The PMOS transistors 411 are used as a switch, and may be equivalent to one PMOS transistor 111 as shown in FIG. 1. The PMOS circuit 41 may be implemented by part of the cell 591 of the semiconductor structure 50. In accordance with some embodiments of the present disclosure, the PMOS transistors 411 may be implemented by the active regions 511. The first inner metal sections 553 and the third inner metal sections 555 are electrically connected to the first backside power line 53 and the first power terminals of the PMOS transistors 411. The second inner metal sections 554 and the fourth inner metal sections 556 are electrically connected to the second backside power line 54 and the second power terminals of the PMOS transistors 411.

Figure 21:
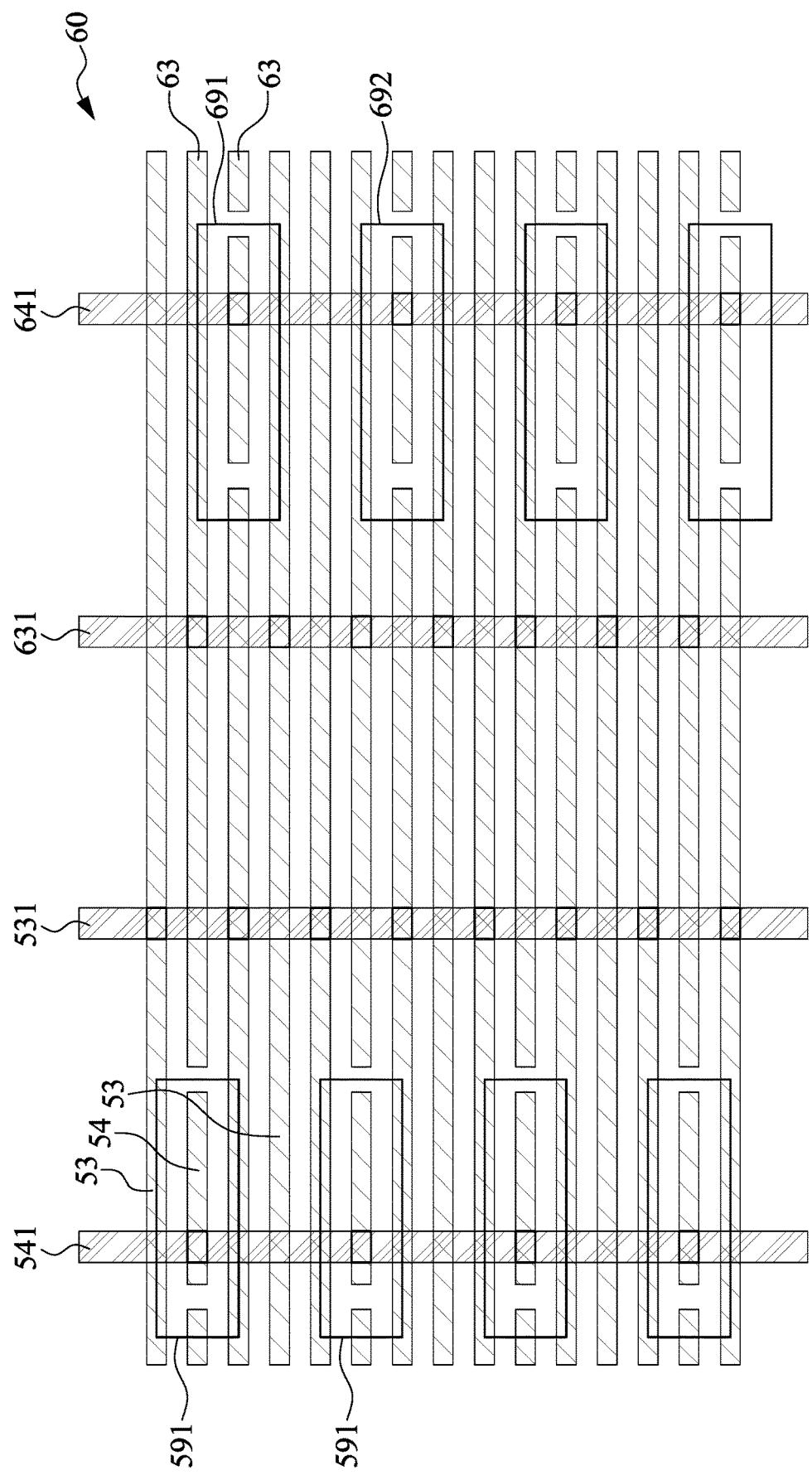
FIG. 21 illustrates a schematic diagram of a semiconductor structure in accordance with some embodiments of the present disclosure.

FIG. 21 illustrates a schematic diagram of a semiconductor structure in accordance with some embodiments of the present disclosure. Referring to FIG. 21, the semiconductor structure 60 further includes a plurality of first cells 591, 592 and second cells 691, 692. The cells 691, 292 may achieve the function of a circuit, for example, the header circuit 11 shown in FIG. 1. The cells 691, 692 may achieve the function of a circuit, for example, the footer circuit 12 shown in FIG. 2. That is, the semiconductor structure 60 utilizes the first cells 591, 592 and the second cells 691, 692 to achieve the two functions of the header circuit 11 and the footer circuit 12. In accordance with some embodiments of the present disclosure, each cell 591 has two first backside power lines 53 and one second backside power line 54, and the second backside power line 54 is disposed between the two first backside power lines 53. Each cell 691 has two third backside power lines 63 and one fourth backside power line 64, and the fourth backside power line 64 is disposed between the two third backside power lines 63. The third backside power lines 63, the fourth backside power line 64, the third connection line 631 and the second connection line 341 may refer to the first backside power lines 33, the second backside power line 34, the first connection line 331, and the second connection line 341 shown in FIG. 15. In accordance with some embodiments of the present disclosure, the cells 691, 692 are also alternately disposed along the second axis, and a distance is disposed between the two cells 691, 692.

Figure 22:
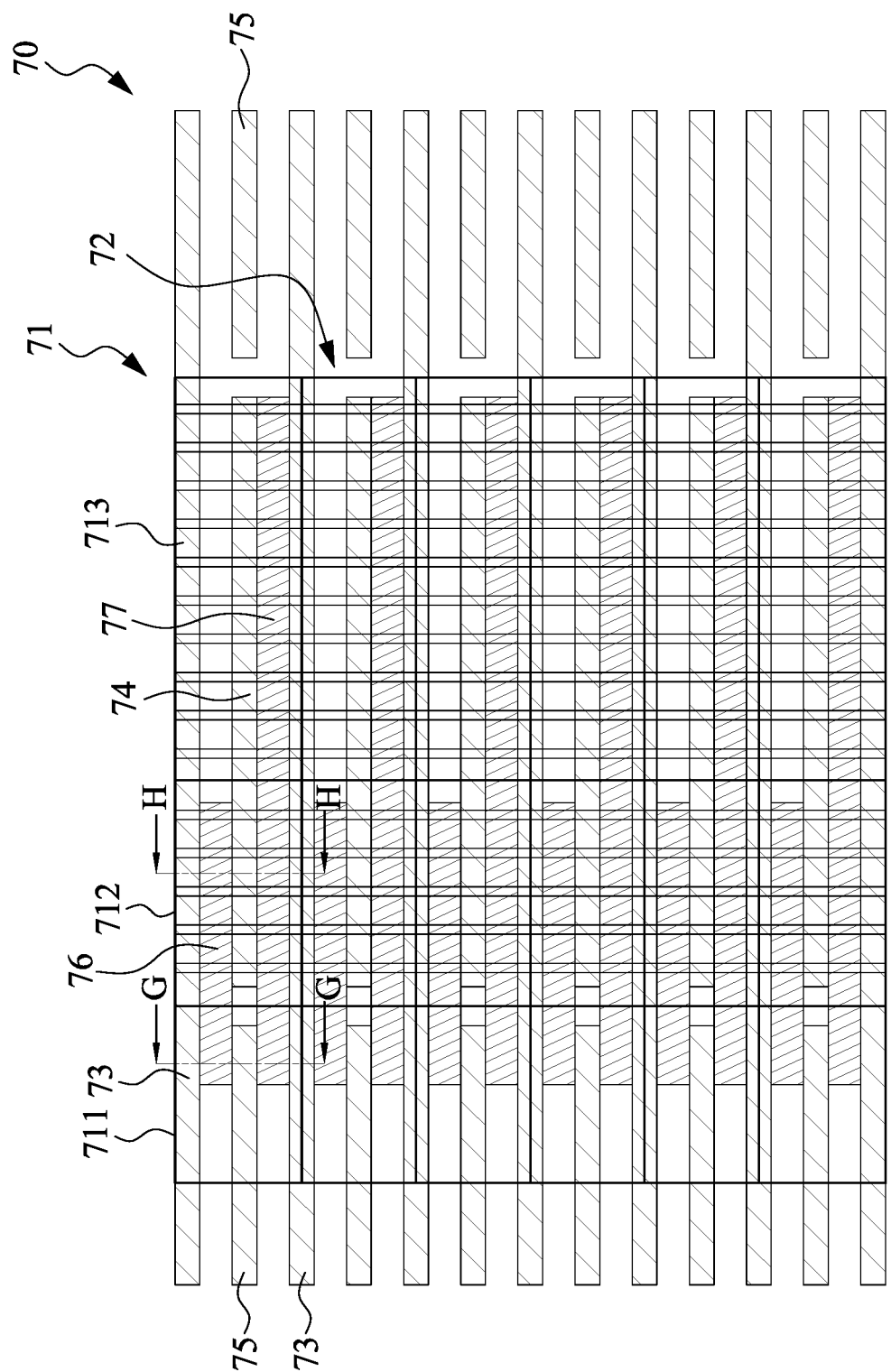
FIG. 22 illustrates a schematic diagram of a semiconductor structure in accordance with some embodiments of the present disclosure.

FIG. 22 illustrates a schematic diagram of a semiconductor structure in accordance with some embodiments of the present disclosure. Referring to FIG. 22, the semiconductor structure 70 includes a plurality of cell groups 71, 72. Each cell group has a control cell, a third power gating cell and a fourth power gating cell. The cell group 71 has a control cell 711, a third power gating cell 712 and a fourth power gating cell 713. The control cell 711 may achieve the function of a circuit, for example, the control portion 133 shown in FIG. 3. The third power gating cell 712 may achieve the function of a circuit, for example, the daughter PMOS transistor 132 shown in FIG. 3. The fourth power gating cell 713 may achieve the function of a circuit, for example, the mother PMOS transistor 131 shown in FIG. 3. Thus, the cell group 71 may achieve the function of a circuit, for example, the mother and daughter type header circuit 13 shown in FIG. 3.

In accordance with some embodiments of the present disclosure, the cell groups 71, 72 are arranged along the second axis. The control cell 711, the third power gating cell 712 and the fourth power gating cell 713 are arranged along the first axis. Each cell has two first backside power lines 73 and one second backside power line 74, and the second backside power line 74 is disposed between the two first backside power lines 73. The first backside power lines 73 and the second backside power line 74 may refer to the first backside power lines 23 and the second backside power line 24 shown in FIG. 9. The semiconductor structure 70 further includes a plurality of third backside power lines 75. The third backside power lines 75 may be electrically connected to a ground. The cell group 71 of semiconductor structure 70 may further includes a first control line 76 and a second control line 77. The first control line 76 extends to the control cell 711 and the third power gating cell 712. The first control line 76 may electrically connected to the control cell 711 and the third power gating cell 712 to control the third power gating cell 712. The first control line 76 may be equivalent to the daughter control terminal 139 of the daughter PMOS transistor 132 as shown in FIG. 3. The second control line 77 extends to the control cell 711, the third power gating cell 712 and the fourth power gating cell 713. The second control line 77 may electrically connected to the control cell 711 and the fourth power gating cell 713 to control the fourth power gating cell 713. The second control line 77 may be equivalent to the mother control terminal 136 of the mother PMOS transistor 131 as shown in FIG. 3.

In accordance with some embodiments of the present disclosure, the cell groups 71, 72 are adjacent to each other along the second axis. In accordance with some embodiments of the present disclosure, each cell shares at least one first backside power line with at least one adjacent cell. For example, the cell groups 71, 72 share the first backside power line 73 disposed between the cell groups 71, 72. For brevity, only the first backside power lines 73, the second backside power lines 74, the third backside power lines 75, the first control line 76 and the second control line 77 of the semiconductor structure 20 are shown in FIG. 22.

Figure 23:
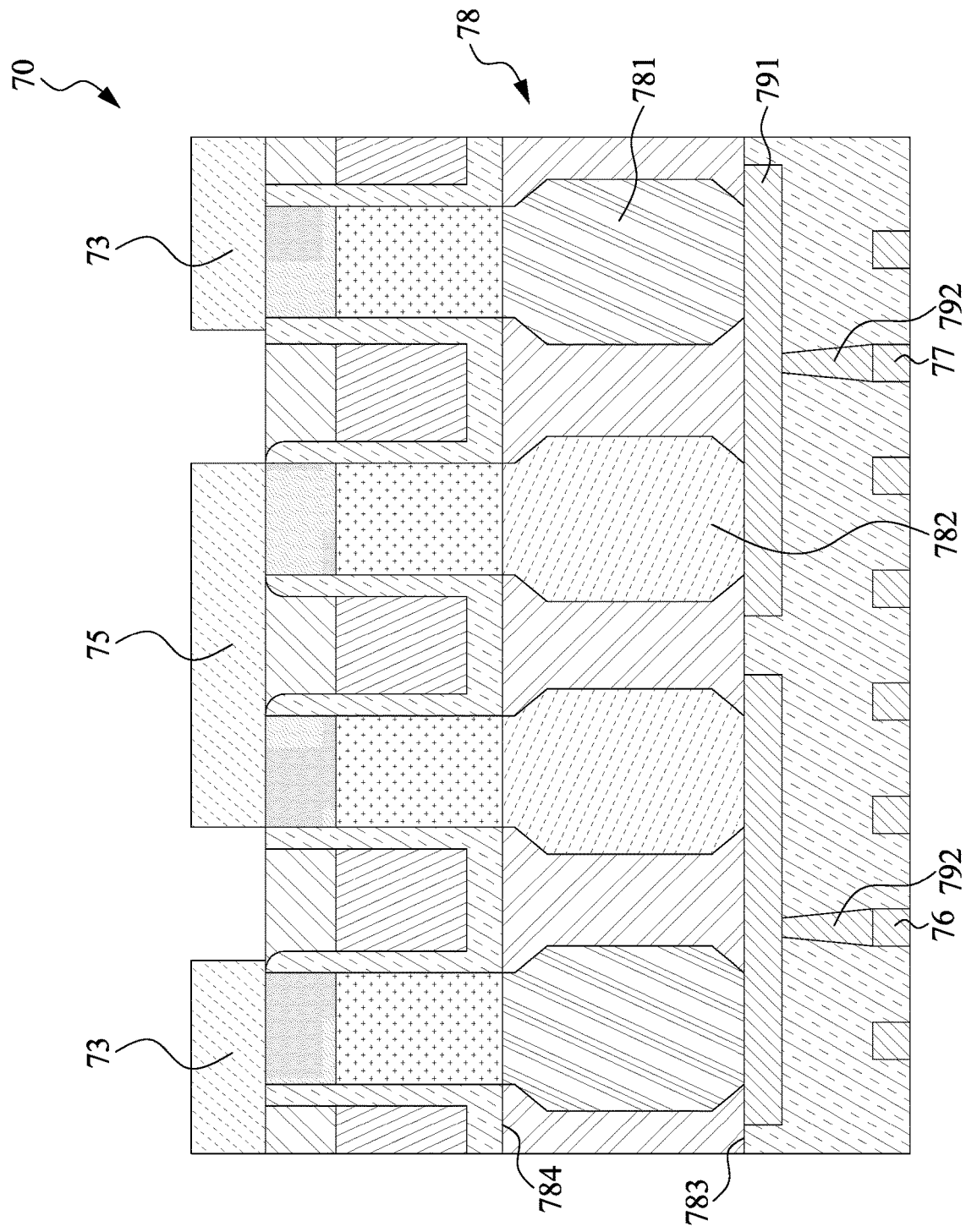
FIG. 23 illustrates a cross sectional view of a semiconductor structure along a cross section line G-G in FIG. 22 in accordance with some embodiments of the present disclosure.
Figure 24:
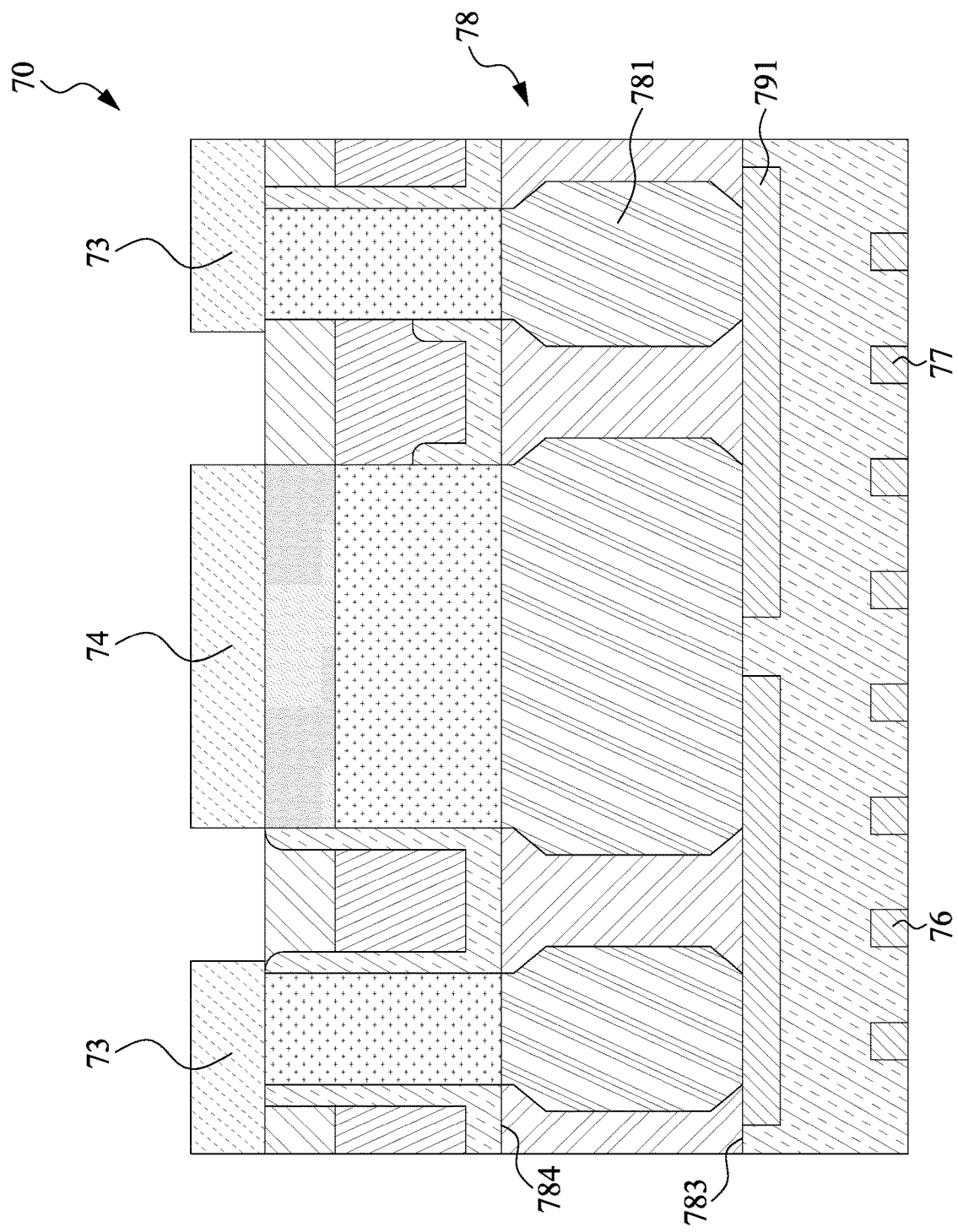
FIG. 24 illustrates a cross sectional view of a semiconductor structure along a cross section line H-H in FIG. 22 in accordance with some embodiments of the present disclosure.

FIG. 23 illustrates a cross sectional view of a semiconductor structure along a cross section line G-G in FIG. 22 in accordance with some embodiments of the present disclosure. FIG. 24 illustrates a cross sectional view of a semiconductor structure along a cross section line H-H in FIG. 22 in accordance with some embodiments of the present disclosure. Referring to FIGS. 22-24, the semiconductor structure 70 further includes a active layer 78. The active layer 78 has a plurality of active regions 781, 782, a front side 783 and a back side 784. The back side 784 is corresponding to the front side 783. In the figures, the semiconductor structure 70 is upside down, and the front side 783 is placed on the bottom of the active layer 78 and the back side 784 is place on the top of the active layer 78. In accordance with some embodiments of the present disclosure, the active regions 781 are configured to be PMOS, and the active regions 782 are configured to be NMOS. The first control line 76 and the second control line 77 may be disposed on the front side 783 of the active layer 78. The first control line 76 and the second control line 77 may be electrically connected to the active regions 781, 782 by a contact layer 791 and vias 792. The first control line 76 and the second control line 77 may be disposed on a first metal layer of the front side 783.

Figure 25:
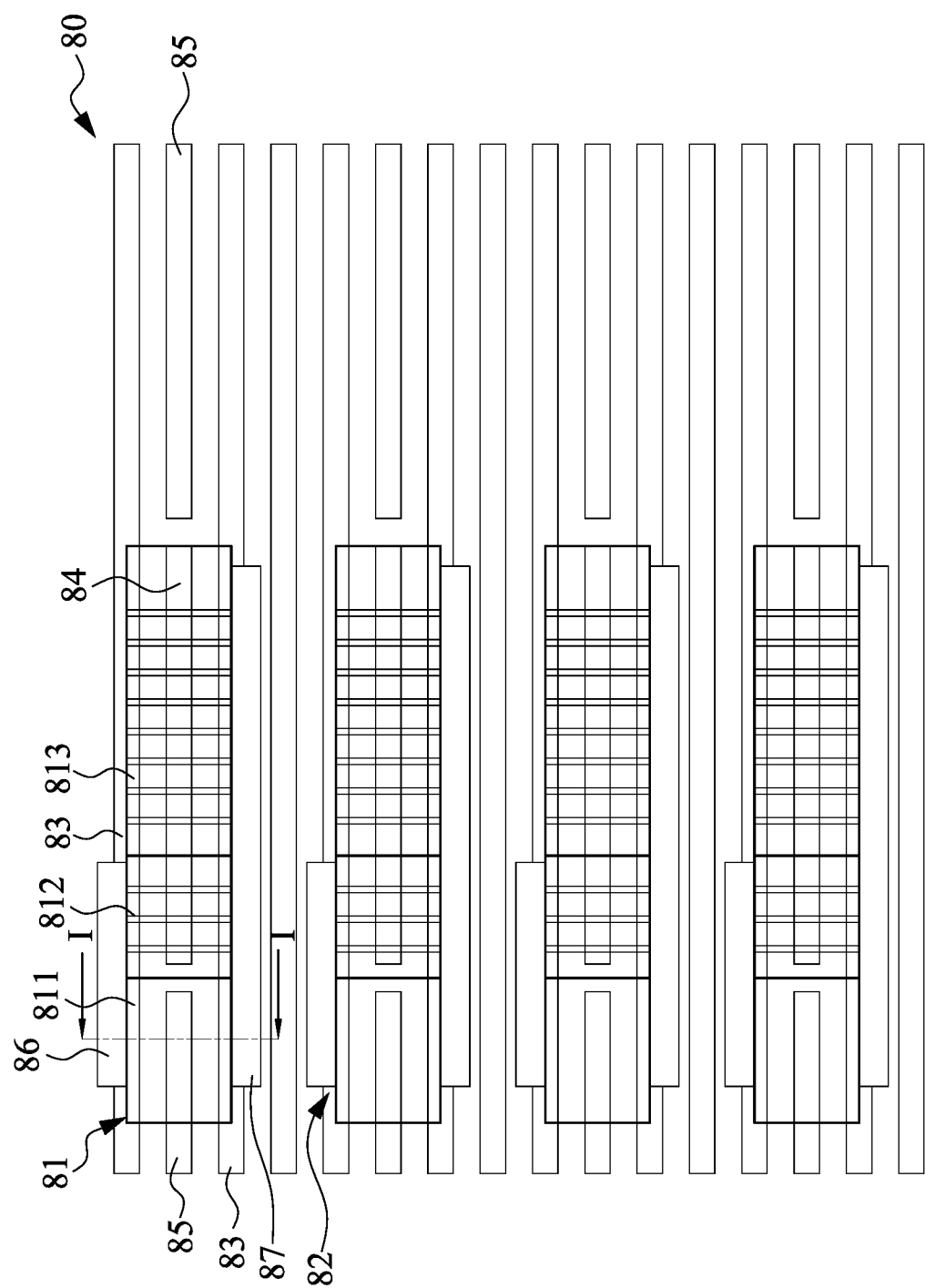
FIG. 25 illustrates a schematic diagram of a semiconductor structure in accordance with some embodiments of the present disclosure.

FIG. 25 illustrates a schematic diagram of a semiconductor structure in accordance with some embodiments of the present disclosure. Referring to FIG. 25, the semiconductor structure 80 includes a plurality of cell groups 81, 82. Each cell group has a control cell, a third power gating cell and a fourth power gating cell. The cell group 81 has a control cell 811, a third power gating cell 812 and a fourth power gating cell 813. The control cell 811 may achieve the function of a circuit, for example, the control portion 133 shown in FIG. 3. The third power gating cell 812 may achieve the function of a circuit, for example, the daughter PMOS transistor 132 shown in FIG. 3. The fourth power gating cell 813 may achieve the function of a circuit, for example, the mother PMOS transistor 131 shown in FIG. 3. Thus, the cell group 81 may achieve the function of a circuit, for example, the mother and daughter type header circuit 13 shown in FIG. 3.

In accordance with some embodiments of the present disclosure, the cell groups 81, 82 are arranged along the second axis. The control cell 811, the third power gating cell 812 and the fourth power gating cell 813 are arranged along the first axis. Each cell has two first backside power lines 83 and one second backside power line 84, and the second backside power line 84 is disposed between the two first backside power lines 83. The first backside power lines 83 and the second backside power line 84 may refer to the first backside power lines 23 and the second backside power line 24 shown in FIG. 9. The semiconductor structure 80 further includes a plurality of third backside power lines 85. The third backside power lines 85 may be electrically connected to a ground. The cell group 81 of semiconductor structure 80 may further includes a first control line 86 and a second control line 87. The first control line 86 is disposed on a side of the control cell 811 and the third power gating cell 812. The first control line 86 may electrically connected to the control cell 811 and the third power gating cell 812 to control the third power gating cell 812. The first control line 86 may be equivalent to the daughter control terminal 139 of the daughter PMOS transistor 132 as shown in FIG. 3. The second control line 87 is disposed on a side of the control cell 811, the third power gating cell 812 and the fourth power gating cell 813. The second control line 87 may electrically connected to the control cell 811 and the fourth power gating cell 813 to control the fourth power gating cell 813. The second control line 87 may be equivalent to the mother control terminal 136 of the mother PMOS transistor 131 as shown in FIG. 3.

In accordance with some embodiments of the present disclosure, the cell groups 81, 82 are alternately disposed along the second axis, and a distance is disposed between the two cell groups 81, 82. For brevity, only the first backside power lines 83, the second backside power lines 84, the third backside power lines 85, the first control line 86 and the second control line 87 of the semiconductor structure 80 are shown in FIG. 25.

Figure 26:
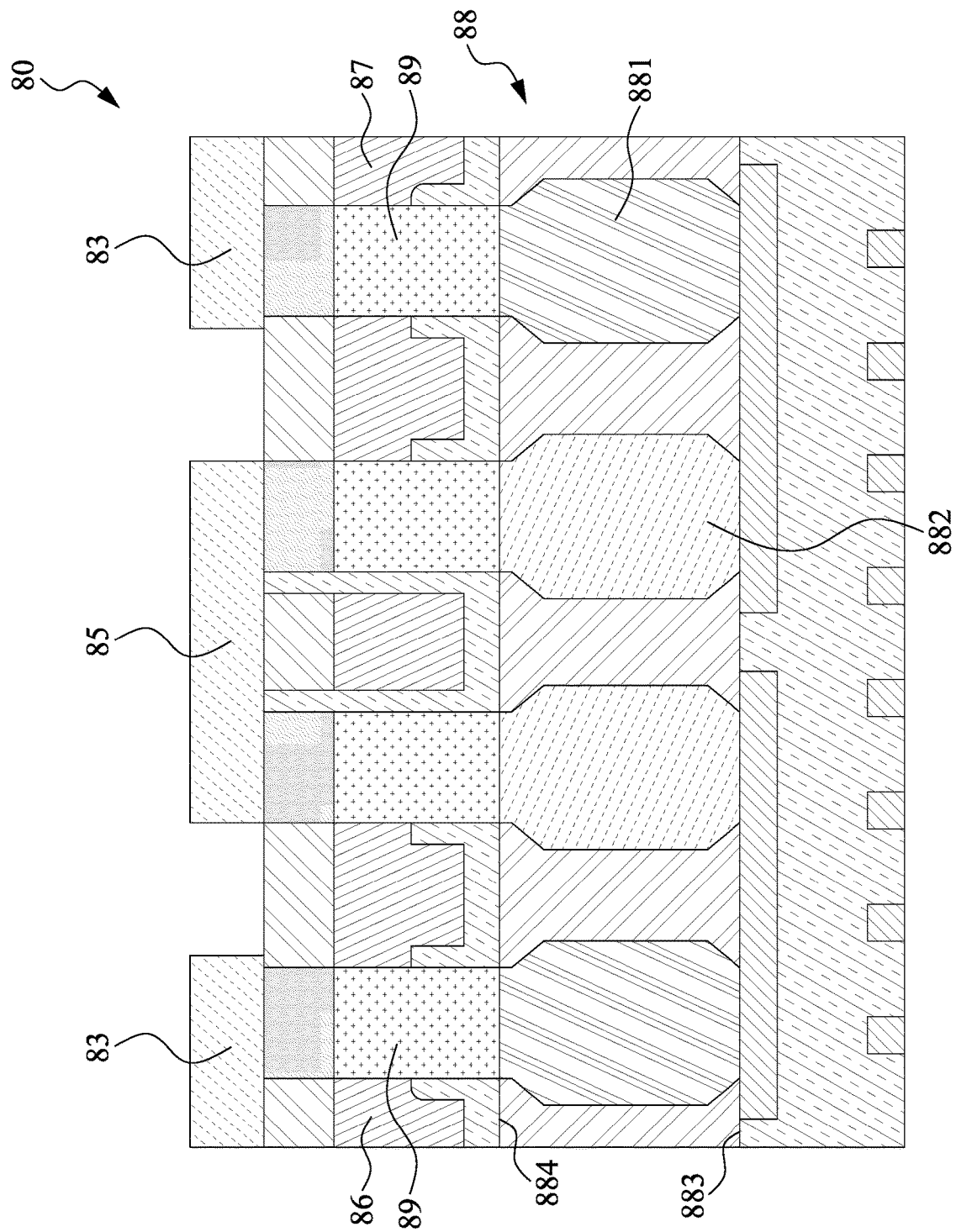
FIG. 26 illustrates a cross sectional view of a semiconductor structure along a cross section line I-I in FIG. 25 in accordance with some embodiments of the present disclosure.

FIG. 26 illustrates a cross sectional view of a semiconductor structure along a cross section line I-I in FIG. 25 in accordance with some embodiments of the present disclosure. Referring to FIG. 25 and FIG. 26, the semiconductor structure 80 further includes a active layer 88. The active layer 88 has a plurality of active regions 881, 882, a front side 883 and a back side 884. The back side 884 is corresponding to the front side 883. In the figures, the semiconductor structure 80 is upside down, and the front side 883 is placed on the bottom of the active layer 88 and the back side 884 is place on the top of the active layer 88. In accordance with some embodiments of the present disclosure, the active regions 881 are configured to be PMOS, and the active regions 882 are configured to be NMOS. The first control line 86 and the second control line 87 may be disposed on the back side 884 of the active layer 88. The first control line 86 and the second control line 87 may be inner metal lines, and electrically connected to the active regions 881, 882 by the metal pillars 89.

In some embodiments, a semiconductor structure is disclosed, including: a plurality of cells. Each cell has a plurality of transistors, a plurality of inner metal lines, two first backside power lines and one second backside power line. The inner metal lines, the first backside power lines and the second backside power line are disposed on a back side of the transistors. The inner metal lines, the first backside power lines and the second backside power line extend along a first axis. The second backside power line is disposed between the two first backside power lines. The inner metal lines are electrically connected to the first backside power lines and the transistors, and electrically connected to the second backside power line and the transistors. The cells are arranged along a second axis, the second axis being vertical to the first axis.

In some embodiments, a semiconductor structure is disclosed, including: an active layer, a plurality of metal pillars, a plurality of first backside power lines, a plurality of second backside power lines, a plurality of inner metal lines, a plurality of spacers and a plurality of isolation caps. The active layer has a plurality of active regions, a front side and a back side. The back side is corresponding to the front side. The metal pillars are disposed on the active regions and on the back side of the active layer, and electrically connected to the active regions. The first backside power lines are disposed on a first group of the metal pillars, and extend along a first axis. The second backside power lines are disposed on a second group of the metal pillars, and extend along the first axis. The inner metal lines are disposed aside the metal pillars, and electrically connected to a third group of the metal pillars and extend along the first axis. The spacers are disposed between the inner metal lines and a fourth group of the metal pillars. The isolation caps are disposed between the first backside power lines and a fifth group of the metal pillars, and are disposed between the second backside power lines and a sixth group of the metal pillars.

In some embodiments, a semiconductor structure is disclosed, including: an active layer, a plurality of metal pillars, a plurality of first backside power lines, a plurality of second backside power lines, a plurality of inner metal lines and a plurality of isolation caps. The active layer has a plurality of active regions, a front side and a back side. The back side is corresponding to the front side. The metal pillars are disposed on the active regions and on the back side of the active layer, and electrically connected to the active regions. The first backside power lines are disposed on a first group of the metal pillars, and extend along a first axis. The second backside power lines are disposed on a second group of the metal pillars, and extend along the first axis. The inner metal lines are disposed aside the metal pillars, and electrically connected to the metal pillars and extend along the first axis. Each inner metal line has a plurality of cut portions. The isolation caps are disposed between the first backside power lines and a fifth group of the metal pillars, and are disposed between the second backside power lines and a sixth group of the metal pillars.

What is claimed is:

1. A semiconductor structure, comprising:
   an active layer, having a plurality of active regions, a front side and a back side, the back side corresponding to the front side;
   a plurality of metal pillars, disposed on the back side of the active layer, and physically contacting the active regions exposed on the back side of the active layer;
   a plurality of first backside power lines, disposed on a first group of the metal pillars, and extending along a first axis;
   a plurality of second backside power lines, disposed on a second group of the metal pillars, and extending along the first axis;
   a plurality of inner metal lines, disposed aside the metal pillars, electrically connected to a third group of the metal pillars and extending along the first axis;
   a plurality of spacers, disposed between the inner metal lines and a fourth group of the metal pillars; and
   a plurality of isolation caps, disposed between the first backside power lines and a fifth group of the metal pillars, and disposed between the second backside power lines and a sixth group of the metal pillars.

2. The semiconductor structure of claim 1, further comprising an isolation layer disposed on the inner metal lines.

3. The semiconductor structure of claim 1, wherein the spacers are disposed at least one side of the fourth group of the metal pillars.

4. The semiconductor structure of claim 1, wherein each of the second backside power lines is disposed between two of the first backside power lines.

5. The semiconductor structure of claim 1, wherein a width of the first backside power lines is greater than a width of the second backside power lines.

6. The semiconductor structure of claim 1, wherein the fifth group of the metal pillars is electrically separated from the first backside power lines by the isolation caps, and the sixth group of the metal pillars is electrically separated from the second backside power lines by the isolation caps.

7. The semiconductor structure of claim 1, wherein a thickness of the fifth and sixth groups of the metal pillars is less than a thickness of the metal pillars contacting the first and second backside power lines.

8. A semiconductor structure, comprising:
   an active layer, having a plurality of active regions, a front side and a back side, the back side corresponding to the front side;
   a plurality of metal pillars, disposed on the active regions and on the back side of the active layer, and electrically connected to the active regions;
   a plurality of first backside power lines, disposed on a first group of the metal pillars, and extending along a first axis;
   a plurality of second backside power lines, disposed on a second group of the metal pillars, and extending along the first axis;
   a plurality of inner metal lines, disposed aside the metal pillars, laterally contacting sidewalls of a third group of the metal pillars and extending along the first axis, each inner metal line having a plurality of cut portions, wherein in each metal pillar of the third group of the metal pillars, the sidewall extends from a first surface facing the active layer to a second surface facing the first and second backside power lines; and
   a plurality of isolation caps, disposed between the first backside power lines and a fifth group of the metal pillars, and disposed between the second backside power lines and a sixth group of the metal pillars.

9. The semiconductor structure of claim 8, wherein each of the second backside power lines is disposed between two of the first backside power lines.

10. The semiconductor structure of claim 8, wherein a width of the first backside power lines is greater than a width of the second backside power lines.

11. The semiconductor structure of claim 8, wherein the fifth group of the metal pillars is electrically separated from the first backside power lines by the isolation caps, and the sixth group of the metal pillars is electrically separated from the second backside power lines by the isolation caps.

12. The semiconductor structure of claim 8, wherein a thickness of the fifth and sixth groups of the metal pillars is less than a thickness of the metal pillars contacting the first and second backside power lines.

13. A semiconductor structure, comprising:
   an active layer, having a plurality of active regions, a front side and a back side, the back side corresponding to the front side;
   a plurality of metal pillars, disposed on the back side of the active layer, and contacting the active regions exposed on the back side of the active layer;
   a plurality of first backside power lines, disposed on a first group of the metal pillars and a second group of metal pillars, and extending along a first axis;
   a plurality of second backside power lines, disposed on a third group of the metal pillars and a fourth group of metal pillars, and extending along the first axis;
   a plurality of first isolation caps, disposed between the first backside power lines and the second group of the metal pillars;
   a plurality of second isolation caps, disposed between the second backside power lines and the fourth group of the metal pillars;
   a plurality of first inner metal lines disposed between the active layer and the first and second backside power lines, electrically connected to the second and third groups of metal pillars and extending along the first axis, wherein two opposite sidewalls of each of the first inner metal lines are in physical contact with sidewalls of the second and third groups of metal pillars, respectively; and
   a plurality of second inner metal lines disposed between the active layer and the first and second backside power lines, electrically connected to the first and fourth groups of metal pillars and extending along the first axis, wherein two opposite sidewalls of each of the second inner metal lines are in physical contact with sidewalls of the first and fourth groups of metal pillars, respectively;

wherein the first inner metal lines and the second inner metal lines are separated by the second backside power lines.

14. The semiconductor structure of claim 13, wherein the first inner metal lines are separated from the first and fourth groups of metal pillars by a spacer, and the second inner metal lines are separated from the second and third groups of metal pillars by the spacer.

15. The semiconductor structure of claim 13, further comprising an isolation layer disposed on the first and second inner metal lines.

16. The semiconductor structure of claim 15, wherein the isolation layer is thicker than the first and second isolation caps.

17. The semiconductor structure of claim 13, wherein the first and third groups of metal pillars are thicker than the second and fourth groups of metal pillars.

18. The semiconductor structure of claim 13, wherein the first group of the metal pillars are in contact with the first backside power lines, and the third group of the metal pillars are in contact with the second backside power lines.

19. The semiconductor structure of claim 13, wherein the first inner metal lines laterally contact the second and third groups of metal pillars, and the second inner metal lines laterally contact the first and fourth groups of metal pillars.

20. The semiconductor structure of claim 13, wherein a width of the first backside power lines is greater than a width of the second backside power lines.

\* \* \* \* \*